United States Patent
Nakanishi

(10) Patent No.: US 7,064,621 B2
(45) Date of Patent: Jun. 20, 2006

(54) SYNCHRONOUS CLOCK GENERATION CIRCUIT CAPABLE OF ENSURING WIDE LOCK-IN RANGE AND ATTAINING LOWER JITTER

(75) Inventor: Jingo Nakanishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 15 days.

(21) Appl. No.: 10/899,070

(22) Filed: Jul. 27, 2004

(65) Prior Publication Data
US 2005/0046497 A1 Mar. 3, 2005

(30) Foreign Application Priority Data
Aug. 13, 2003 (JP) ............... 2003-292938

(51) Int. Cl.
*H03L 7/087* (2006.01)
(52) U.S. Cl. ............... 331/57; 331/14; 331/11
(58) Field of Classification Search ........... 331/57, 331/179, 11, 14
See application file for complete search history.

(56) References Cited

U.S. PATENT DOCUMENTS 6,466,100 B1 * 10/2002 Mullgrav et al. .......... 331/179
6,563,387 B1 * 5/2003 Hirano et al. .............. 331/11

FOREIGN PATENT DOCUMENTS

| JP | 05-110429 | 4/1993 |
| JP | 2001-144607 | 5/2001 |
| JP | 2002-152039 | 5/2004 |

* cited by examiner

*Primary Examiner*—Joseph Chang
(74) *Attorney, Agent, or Firm*—McDermott Will & Emery LLP

(57) ABSTRACT

At a first step, in a synchronous clock generation circuit, the number of delay stages serving as a digital PLL circuit is increased/decreased, and an oscillation circuit performs an oscillation operation when an optimal number of delay stages is set. Thereafter, in an operation at a second step, a control voltage is controlled with the optimal number of delay stages being set for serving as an analog PLL circuit, thereby attaining a lock-in state. As the lock-in state is finally maintained under analog control, an excellent jitter characteristic can be obtained. Thus, ensuring a lock-in range that has been a problem in the analog PLL circuit is solved by varying the number of delay stages in the operation at the first step, and a high jitter characteristic that has been a problem in a digital PLL circuit can be solved by analog control in the operation at the second step.

18 Claims, 15 Drawing Sheets

SYNCHRONOUS CLOCK GENERATION CIRCUIT CAPABLE OF ENSURING WIDE LOCK-IN RANGE AND ATTAINING LOWER JITTER

BACKGROUND OF THE INVENTION

1. Field of the Invention

The present invention relates to a synchronous clock generation circuit.

2. Description of the Background Art

In a conventional semiconductor integrated circuit, a phase-locked loop (PLL) circuit has been used in order to achieve synchronization of phases of clocks in and out of a chip, or to obtain a clock having a frequency being a multiple of that of an external clock. The PLL circuit is broadly categorized into an analog PLL circuit and a digital PLL circuit.

In general, the analog PLL circuit is constituted of an analog phase comparator, a charge pump, a loop filter, a voltage controlled oscillator, and a frequency divider.

On the other hand, the digital PLL circuit is generally constituted of a digital phase comparator, a control circuit, a digital controlled oscillator, and a frequency divider.

In a current PLL circuit, whereas the analog phase comparator used in the analog PLL circuit attains an excellent phase noise characteristic, it has a narrow capture range. On the other hand, though the digital phase comparator used in the digital PLL circuit attains a wide capture range, its phase noise characteristic is poorer than that of the analog phase comparator. Therefore, Japanese Patent Laying-Open No. 2002-152039 discloses a PLL circuit utilizing combined advantages of the both.

In the conventional art disclosed in Japanese Patent Laying-Open No. 2002-152039, in order to achieve the low noise characteristic of the analog phase comparator and the wide lock capture characteristic of the digital phase comparator, two types of phase comparators are switched before and after locking. On the other hand, as a conventional VCO is employed, problems originating from the VCO still remain.

First, a VCO used in the analog PLL circuit will be described. A general ring oscillator-type VCO is constituted of an odd number of inversion delay stages connected so as to form a ring. An oscillation frequency is varied when a delay time at each delay stage varies in accordance with a control voltage. The analog PLL circuit using such a VCO disadvantageously has a narrow capture range.

For example, the VCO attains a high oscillation frequency when the control voltage is raised, while it attains a low oscillation frequency when the control voltage is lowered. In general, a control voltage of a value between a ground voltage and a power supply potential is applied. The control voltage actually applicable, however, is of a value in a range from (a threshold voltage of an N-channel transistor) to (a potential obtained by subtracting a threshold voltage of a P-channel MOS transistor and the like from the power supply potential), that is, in a range from Vthn to VDD−|Vthp|.

As the tendency toward lower voltage grows, a proportion of the threshold voltage with respect to the power supply voltage will be relatively larger. Therefore, a range available for use as the control voltage tends to be narrower. In order to obtain a similar oscillation frequency range (a range from a lowest frequency to a highest frequency) in a narrower control voltage range, sensitivity of the VCO may be enhanced, however, this will lead to increased susceptibility to noise.

FIG. 15 illustrates a range available for use in the VCO. As shown in FIG. 15, considering a change due to a process, a power supply voltage and a temperature, the oscillation frequency range under respective conditions in states from best to worst varies to a large extent.

Here, solely a range where all oscillation frequency ranges overlap, that is, the range available for use indicated in FIG. 15, is applicable as the oscillation frequency range of the VCO. As the tendency toward smaller size and lower voltage grows, influence from a change in the process or the power supply voltage will be more significant, and ensuring the oscillation frequency range will increasingly be difficult. Generally, as a lock-in range of the analog PLL circuit is substantially equal to the oscillation frequency range of the VCO, maintaining a wide oscillation frequency range of the VCO is a major future challenge.

The digital controlled oscillator used in the digital PLL circuit will now be described. The digital controlled oscillator is constituted of a logic inversion circuit (inverter), a plurality of delay stages, and a selection circuit selecting any one of outputs from the plurality of delay stages and providing the selected output to an input of the logic inversion circuit. When the delay stage selected by the selection circuit is changed, the number of delay stages and inverter connected so as to form a loop is varied, whereby the total delay time is changed. The oscillation frequency can thus be varied.

In other words, in the digital controlled oscillator used in the digital PLL circuit, the oscillation frequency is controlled by changing the number of delay stages. Accordingly, if the delay time of one delay stage is shortened and the number of delay stages is increased, a wider lock-in range can readily be achieved. On the other hand, the digital controlled oscillator used in the digital PLL tends to generate jitter not smaller than that caused by at least one delay stage in nature. This jitter is relatively larger than that in the VCO used in the analog PLL circuit, and a jitter characteristic is not necessarily excellent.

As described above, in the current PLL circuit, it has been difficult to ensure the lock-in range in the analog PLL circuit, while the jitter characteristic of the digital PLL circuit has been poor due to characteristics of an oscillator used.

SUMMARY OF THE INVENTION

An object of the present invention is to provide a synchronous clock generation circuit capable of ensuring a wide lock-in range and attaining an excellent jitter characteristic.

According to the present invention, a synchronous clock generation circuit including an oscillation circuit and a control circuit is provided. The oscillation circuit provides an output clock signal having an oscillation frequency varied in a discrete manner in accordance with digital control information and provides an output clock signal having an oscillation frequency continuously varied in accordance with analog control information. The control circuit temporarily fixes the analog control information to a prescribed value and controls the digital control information in accordance with the output clock signal so as to achieve a first lock state in which a phase difference between the output clock signal and an input clock signal is not larger than a first prescribed value. After the first lock state is established, the control circuit fixes the digital control information and controls the analog control information in accordance with the oscillation frequency so as to achieve a second lock state in which a phase difference between the output clock signal and the input clock signal is not larger than a second prescribed value.

According to the present invention, a delay stage having a delay amount varied in accordance with the analog control information and the digital control information is employed. At a first step, the analog control information is fixed to a prescribed value, while a delay amount at a delay stage is varied in a discrete manner in accordance with the digital control information, for synchronization control of the clock signals. When synchronization control is locked at the first step, the digital control information at that time point is fixed. Then, at a second step, the analog control information is changed and synchronization control is performed. Finally, a lock-in state is maintained under the analog control.

In other words, initially under digital control, the delay amount at the delay stage is coarsely varied, so as to ensure a wide lock range. Then, under subsequent analog control, the delay amount is finely varied. Thus, an excellent jitter characteristic can finally be obtained in locking. Thus, a lock-in range is ensured and an excellent jitter characteristic can be attained The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
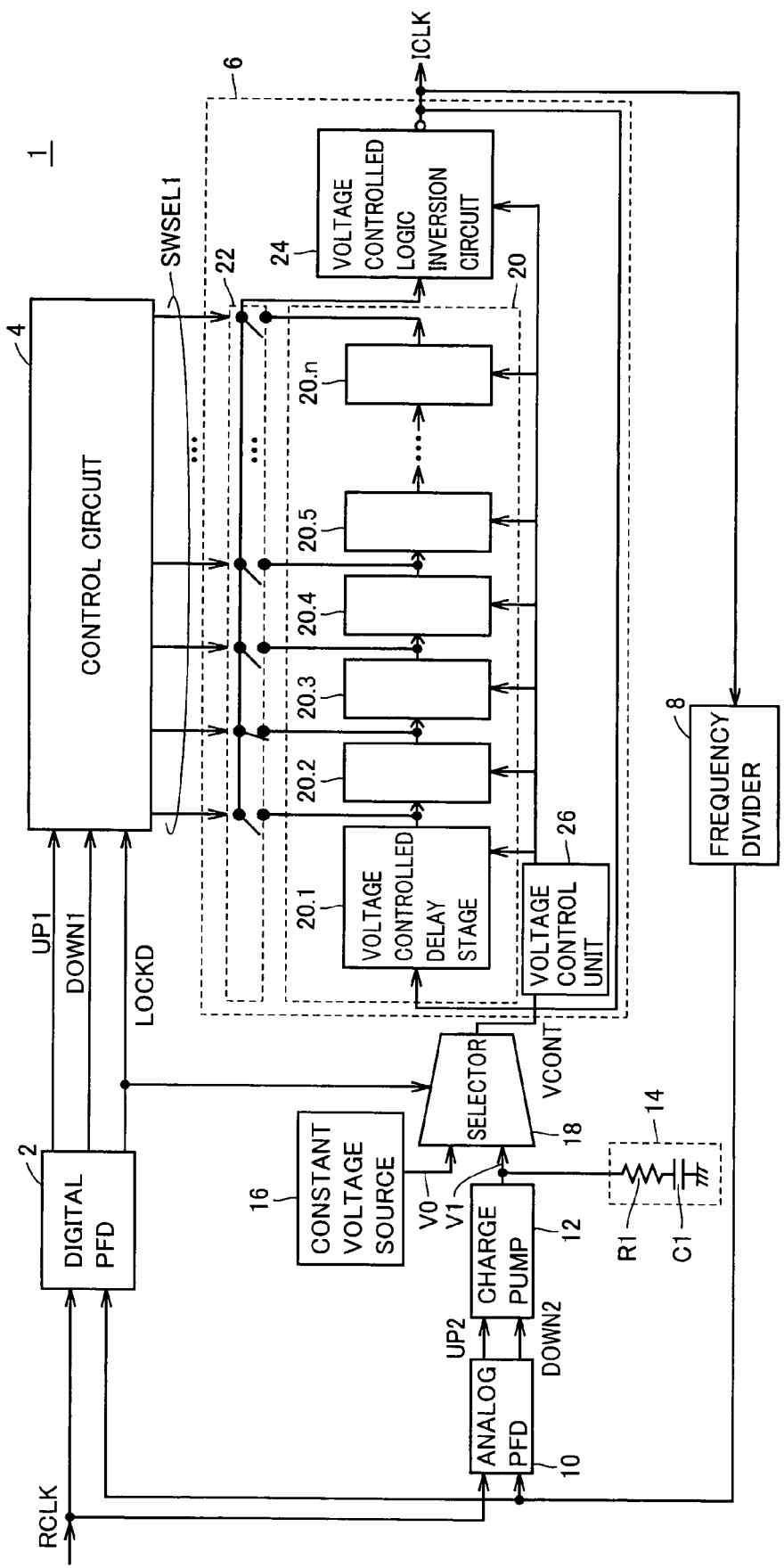
FIG. 1 is a circuit diagram showing a configuration of a synchronous clock generation circuit 1 in Embodiment 1.

In the following, embodiments of the present invention will be described in detail with reference to the figures. It is noted that the same reference characters refer to the same or corresponding components in the figures.

Embodiment 1

FIG. 1 is a circuit diagram showing a configuration of a synchronous clock generation circuit 1 in Embodiment 1.

Referring to FIG. 1, synchronous clock generation circuit 1 includes a frequency divider 8 dividing a frequency of a clock signal ICLK used in the chip; a digital PFD (phase comparator) 2 comparing a phase of an output signal from frequency divider 8 with a phase of an externally provided reference clock signal RCLK and outputting control signals UP1, DOWN1 and LOCKD; a control circuit 4 adjusting a frequency by varying a control signal SWSEL1 in accordance with control signals UP1, DOWN1, and fixing control signal SWSEL1 so as to maintain a current frequency when control signal LOCKD is activated; and an oscillation circuit 6 having an oscillation frequency varied in a discrete manner in accordance with control signal SWSEL1. When a control voltage VCONT varies, the oscillation frequency of oscillation circuit 6 continuously varies.

Synchronous clock generation circuit 1 further includes an analog PFD 10 comparing the phase of the output signal from frequency divider 8 with the phase of clock signal RCLK and outputting signals UP2, DOWN2; a charge pump 12 charging/discharging an output node in accordance with signals UP2, DOWN2; a loop filter 14 connected to an output node of charge pump 12 and smoothing a voltage; a constant voltage source 16 outputting a constant potential V0; and a selector 18 selecting any one of a potential V1 smoothed by loop filter 14 and constant potential V0 in accordance with control signal LOCKD and outputting control voltage VCONT. Control voltage VCONT is provided to oscillation circuit 6, which continuously varies its oscillation frequency in accordance with control voltage VCONT.

Loop filter 14 includes a resistor R1 and a capacitor C1 connected in series between the output node of charge pump 12 and the ground node. Loop filter 14 serves to smooth voltage fluctuation caused by charging/discharging of the output node by charge pump 12. For example, an output of loop filter 14 may serve as a connection node of resistor R1 and capacitor C1, and a potential of the connection node may be provided to selector 18 as a voltage V1.

Oscillation circuit 6 includes a delay circuit 20 including a plurality of voltage controlled delay stages 20.1 to 20.n connected in series; a selection circuit 22 selecting one of a plurality of outputs from delay circuit 20 in accordance with control signal SWSEL1; a voltage controlled logic inversion circuit 24 receiving and inverting an output selected by selection circuit 22 and outputting clock signal ICLK; and a voltage control unit 26. Clock signal ICLK is also provided to an input of voltage controlled delay stage 20.1 in addition to frequency divider 8.

Figure 2:
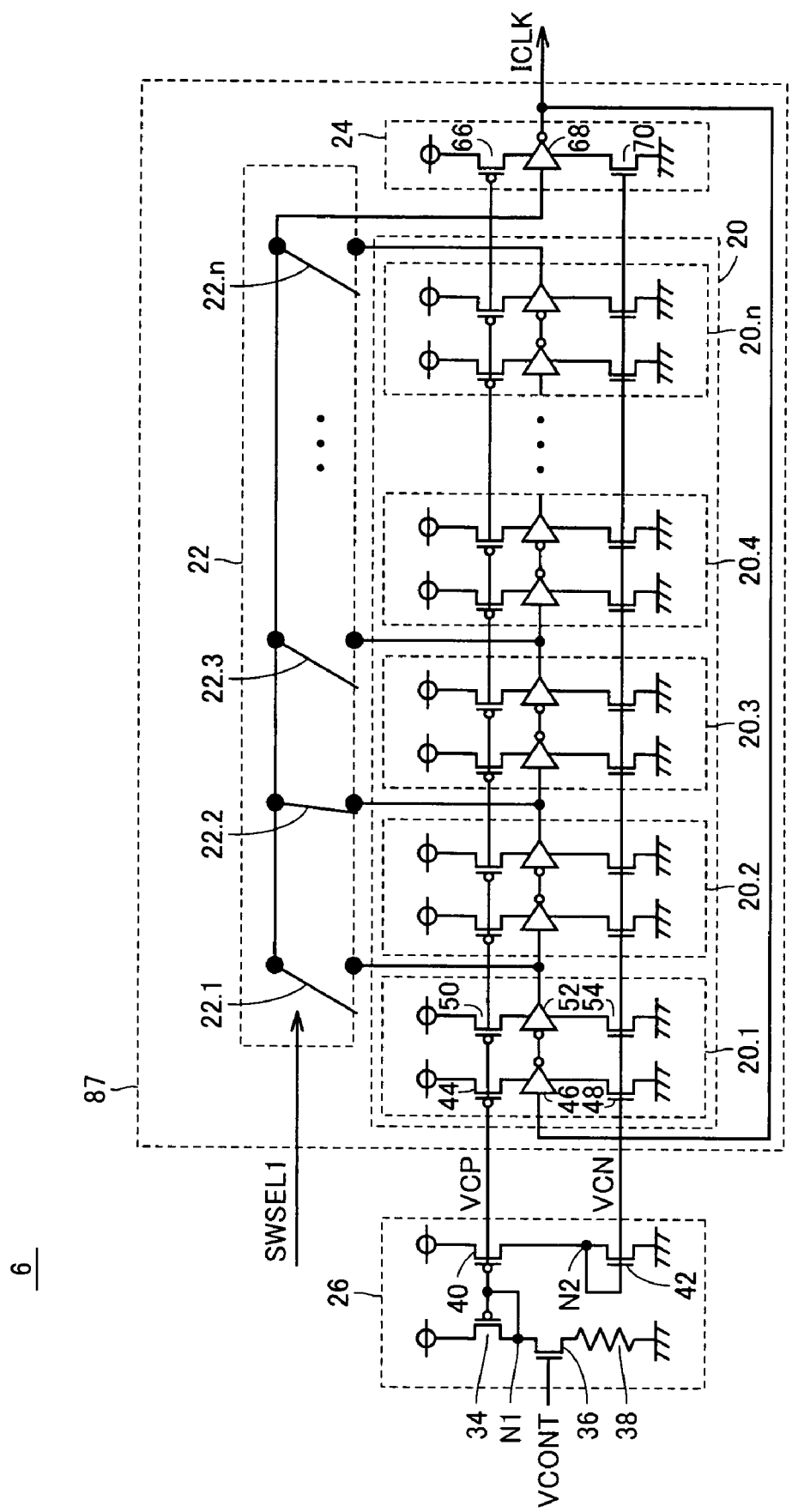
FIG. 2 is a circuit diagram showing a configuration of an oscillation circuit 6.

FIG. 2 is a circuit diagram showing a configuration of oscillation circuit 6.

Referring to FIG. 2, oscillation circuit 6 includes voltage control unit 26 receiving control voltage VCONT and outputting control voltages VCP, VCN, and an oscillation unit 87 receiving control signal SWSEL1 as the digital control information, receiving control voltages VCP, VCN varied in accordance with control voltage VCONT as the analog control information, and having its oscillation frequency varied in accordance with the digital and analog control information.

Voltage control unit 26 includes a P-channel MOS transistor 34 diode-connected between the power supply node and a node N1; an N-channel MOS transistor 36 and a resistance element 38 connected in series between node N1 and the ground node; a P-channel MOS transistor 40 connected between the power supply node and a node N2 and having the gate connected to node N1; and an N-channel MOS transistor 42 diode-connected between node N2 and the ground node. The gate of N-channel MOS transistor 36 receives control voltage VCONT. In addition, node N1 outputs control voltage VCP, while node N2 outputs control voltage VCN.

Oscillation unit 87 includes delay circuit 20 including a plurality of outputs having different delay amounts respectively; selection circuit 22 selecting one of the plurality of outputs from delay circuit 20 in accordance with signal SWSEL1; and voltage controlled logic inversion circuit 24 receiving and inverting an output selected by selection circuit 22 and outputting signal ICLK. Clock signal ICLK output from voltage controlled logic inversion circuit 24 is provided to an input of delay circuit 20.

Delay circuit 20 includes a plurality of delay stages 20.1 to 20.n connected in series and each having a delay time varied in accordance with control voltages VCP, VCN.

Delay stage 20.1 includes a P-channel MOS transistor 44 and an N-channel MOS transistor 48 receiving control voltages VCP, VCN respectively at the gates, and an inverter 46 connected in series between P-channel MOS transistor 44 and N-channel MOS transistor 48 in a path from the power supply node to the ground node and receiving and inverting an input signal. Delay stage 20.1 receives signal ICLK as the input signal.

Delay stage 20.1 further includes a P-channel MOS transistor 50 and an N-channel MOS transistor 54 receiving control voltages VCP, VCN respectively at the gates, and an inverter 52 connected in series between P-channel MOS transistor 50 and N-channel MOS transistor 54 in a path from the power supply node to the ground node and receiving and inverting an output from inverter 46. An output of inverter 52 is input to a delay circuit at a next stage. As the configuration of each of delay stages 20.2 to 20.n is similar to that of delay stage 20.1, description thereof will not be repeated.

Selection circuit 22 includes switches 22.1 to 22.n for selecting outputs from delay stages 20.1 to 20.n respectively. In accordance with control signal SWSEL1, one of switches 22.1 to 22.n is connected, and remaining switches are not connected.

Voltage controlled logic inversion circuit 24 includes a P-channel MOS transistor 66 and an N-channel MOS transistor 70 receiving control voltages VCP, VCN provided from voltage control unit 26 at the gates respectively, and an inverter 68 connected in series between P-channel MOS transistor 66 and N-channel MOS transistor 70 in a path from the power supply node to the ground node, receiving and inverting an output from selection circuit 22, and outputting signal ICLK.

When control voltage VCONT increases, N-channel MOS transistor 36 enters a stronger conductive state, and a source-drain current flowing through N-channel MOS transistor 36 increases. Accordingly, a current flowing through node N2 also increases. Then, the voltage at node N1 is lowered, and the voltage at node N2 rises.

In response to this change, delay stages 20.1 to 20.n connected to nodes N1, N2 and voltage controlled logic inversion circuit 24 generate a smaller delay time, resulting in a higher oscillation frequency.

In contrast, when control voltage VCONT is lowered, the current flowing through node N2 decreases. Then, the delay time of delay stages 20.1 to 20.n and voltage controlled logic inversion circuit 24 is extended and the oscillation frequency is lowered. When the output selected by selection circuit 22 is changed in accordance with control signal SWSEL1, the number of stages in the ring oscillator is changed, resulting in change in the oscillation frequency in a discrete manner.

In oscillation circuit 6, the oscillation frequency is roughly determined in a discrete manner when one of the switches included in selection circuit 22 is turned on in accordance with control signal SWSEL1 and a loop including an arbitrary number of delay stages and the logic inversion circuit is implemented. Thereafter, when control voltage VCONT is changed, a delay amount at each delay stage is varied and the oscillation frequency can continuously be adjusted finely. In other words, the oscillation frequency of oscillation circuit 6 can be varied in accordance with two types of signals, i.e., control voltage VCONT and control signal SWSEL1. In this manner, an operation as achieved by a combination of the VCO in the analog PLL circuit and the digital controlled oscillator in the digital PLL circuit is performed.

Based on the description above, an operation of a circuit in Embodiment 1 will now be discussed. Broadly speaking, synchronous clock generation circuit 1 in Embodiment 1 performs an operation in two steps. First, in the operation at a first step, digital PFD 2 in FIG. 1 inactivates control signal LOCKD, so as to indicate an unlocked state. In response to this signal, control circuit 4 performs a normal operation and selector 18 selects voltage V0 output by constant voltage source 16.

Attention is now paid to oscillation circuit 6 in FIG. 1. Output voltage V0 from constant voltage source 16 is provided as a control voltage for this oscillation circuit. Therefore, voltage controlled delay stages 20.1 to 20.n and voltage controlled logic inversion circuit 24 maintain a prescribed delay time. These components can be regarded as general delay stages and an inverter. In other words, oscillation circuit 6 has the oscillation frequency varied depending solely on change in the number of delay stages. This is an operation exactly the same as that of the digital controlled oscillator used in the conventional digital PLL circuit. In addition, as analog PFD 10, charge pump 12 and loop filter 14 in FIG. 1 are not selected by selector 18, an instruction to raise/lower the oscillation frequency is issued solely by digital PFD 2. That is, the operation of the synchronous clock generation circuit at the first step in Embodiment 1 can be regarded as that of the digital PLL circuit, and this operation is identical to that of the digital PLL circuit.

An operation at a second step will now be described. At the first step, the synchronous clock generation circuit operates in a manner the same as the digital PLL circuit. When lock-in of the digital PLL circuit is completed, the operation at the second step is performed. When locking at the first step is completed, digital PFD 2 in FIG. 1 activates control signal LOCKD. Then, control circuit 4 stops its operation with current control information being held, and selector 18 selects voltage V1 of the node connected to loop filter 14 as control voltage VCONT.

Here, it is assumed that lock-in is completed in a state in which two voltage controlled delay stages are selected at the first step. As control circuit 4 has stopped its operation with current information being held, the state in which two voltage controlled delay stages 20.1 and 20.2 have been selected is maintained.

When attention is paid to oscillation circuit 6, the number of voltage controlled delay stages has been fixed. Therefore, the oscillator varies the oscillation frequency depending solely on control voltage V1. This operation is exactly the same as that of the voltage controlled oscillator (VCO) used in the analog PLL circuit.

Regarding oscillation circuit 6 as the VCO and referring to FIG. 1, it can be seen that synchronous clock generation circuit 1 shown in FIG. 1 is exactly the same as the analog PLL circuit. In other words, the synchronous clock generation circuit in Embodiment 1 operates in a manner the same as the analog PLL circuit in the operation at the second step. Analog PFD 10 in FIG. 1 has sensitivity higher than that of digital PFD 2, and is able to detect a slight phase shift. Therefore, even after the first lock state is recognized by digital PFD 2, analog PFD 10 has not yet detected the lock state, and the frequency of the oscillation circuit is controlled so as to lower jitter.

In summary, the synchronous clock generation circuit in Embodiment 1 increases/decreases the number of delay stages serving as the digital PLL circuit at the first step. Then, when an optimal number of delay stages is set, the operation at the second step is performed.

In the operation at the second step, the control voltage is controlled with the optimal number of delay stages being set so as to serve as the analog PLL circuit, and the lock-in state is established. As the lock-in state is finally maintained under analog control, an excellent jitter characteristic can be obtained. In other words, in Embodiment 1, ensuring a lock-in range that has been a problem in the analog PLL circuit is solved by varying the number of the delay stages in the operation at the first step, and a high jitter characteristic that has been a problem in the digital PLL circuit can be solved by analog control in the operation at the second step.

Embodiment 2

In Embodiment 2, the synchronous clock generation circuit shown in FIG. 1 includes a control circuit 104 and an oscillation circuit 106 instead of control circuit 4 and oscillation circuit 6 respectively.

Figure 3:
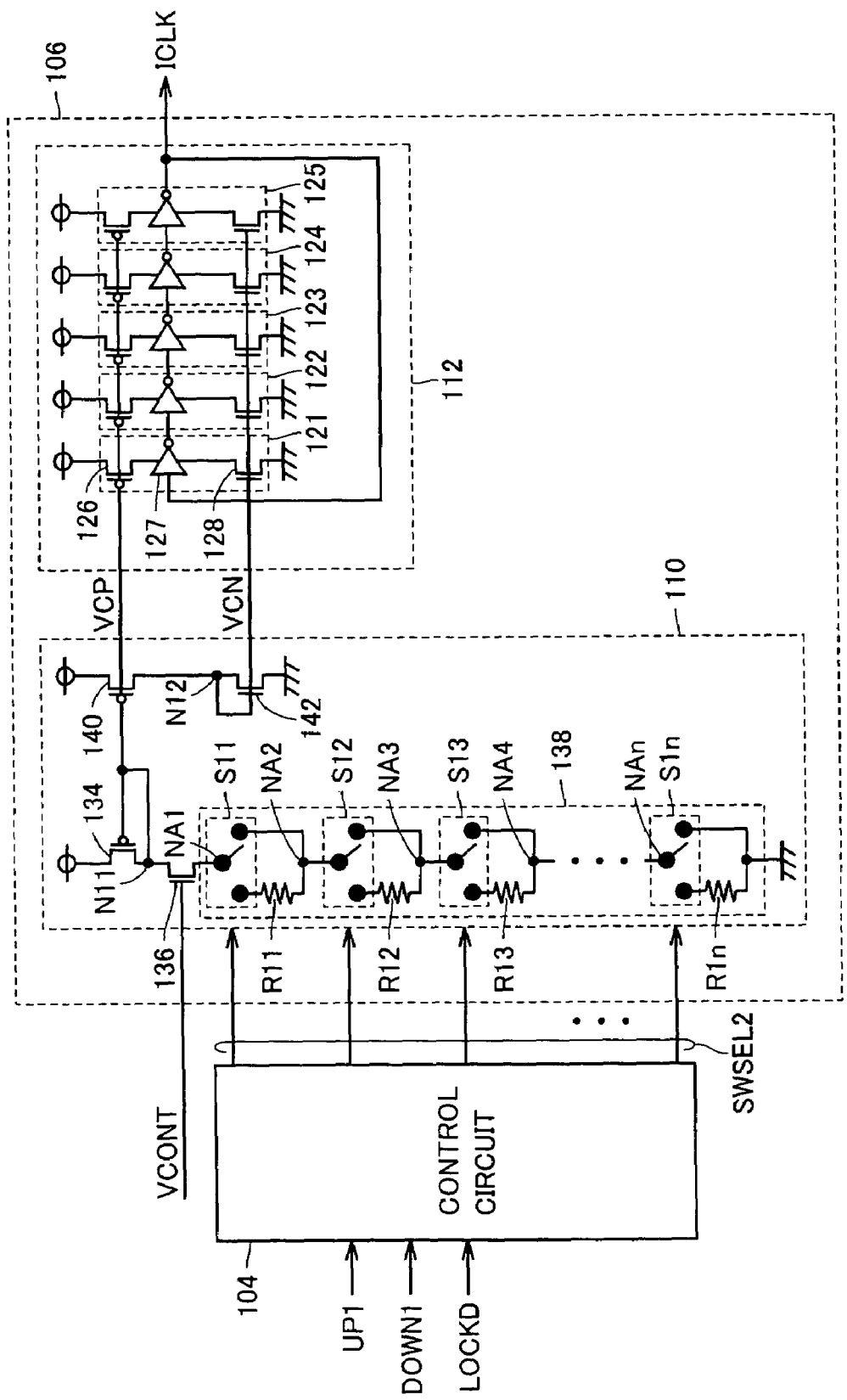
FIG. 3 is a circuit diagram showing a configuration of a control circuit and an oscillation circuit used in Embodiment 2.

FIG. 3 is a circuit diagram showing a configuration of a control circuit and an oscillation circuit used in Embodiment 2.

Referring to FIG. 3, control circuit 104 is connected to digital PFD 2 in FIG. 1, receives control signals UP1, DOWN1 and LOCKD, and outputs a control signal SWSEL2.

Oscillation circuit 106 includes a voltage control circuit 110 outputting control voltages VCP, VCN in accordance with control voltage VCONT and control signal SWSEL2, and a ring oscillator 112 providing oscillation clock signal ICLK having an frequency varied in accordance with an output from voltage control circuit 110. Ring oscillator 112 includes five inversion delay circuits 121 to 125 connected so as to form a ring. Inversion delay circuit 125 outputs clock signal ICLK.

Inversion delay circuit 121 includes a P-channel MOS transistor 126 and an N-channel MOS transistor 128 receiving control voltages VCP, VCN respectively at the gates, and an inverter 127 connected in series between P-channel MOS transistor 126 and N-channel MOS transistor 128 in a path from the power supply node to the ground node and receiving and inverting an input signal. As the configuration of each of inversion delay circuits 122 to 125 is similar to that of inversion delay circuit 121, description thereof will not be repeated.

The operation of ring oscillator 112 is the same as described in connection with FIG. 2. That is, when control voltages VCP, VCN vary, a delay amount of each inversion delay circuit also varies, whereby the oscillation frequency can be adjusted.

Voltage control circuit 110 includes a P-channel MOS transistor 134 diode-connected between the power supply node and a node N11, an N-channel MOS transistor 136 connected between node N11 and a node NA1 and receiving control voltage VCONT at the gate, and a resistor circuit 138 connected between node NA1 and the ground node and having a resistance value across opposing ends varied in a discrete manner in accordance with control signal SWSEL2.

Voltage control circuit 110 further includes a P-channel MOS transistor 140 connected between the power supply node and a node N12 and having the gate connected to node N11 and an N-channel MOS transistor 142 diode-connected between node N12 and the ground node. Control voltage VCP is output from node N11, while control voltage VCN is output from node N12.

Resistor circuit 138 includes switches S11 to S1n and resistors R11 to R1n. Switch S11 selects between direct connection of nodes NA1 and NA2 and connection of these two nodes with resistor R11 being interposed. Switch S12 selects between direct connection of nodes NA2 and NA3 and connection of these two nodes with resistor R2 being interposed. Switch S13 selects between direct connection of nodes NA3 and NA4 and connection of these two nodes with resistor R13 being interposed. Switch S1n selects between direct connection of node NAn and the ground node and connection of these two nodes with resistor R1n being interposed.

Here, it is assumed that control circuit 104 outputs control signal SWSEL2 so that switch S11 and switch 12 select resistors R11, R12 respectively and all other switches S13 to S1n directly connect to corresponding nodes respectively while control voltage VCONT is constant. If each resistor has an equal resistance value of RΩ, the resistance value across node NA1 of resistor circuit 138 and the ground node is set to 2RΩ. Here, clock oscillation takes place in the operation exactly the same as in the VCO used in the analog PLL circuit.

Then, if control circuit 104 outputs control signal SWSEL2 so that resistor R13 is further selected in addition to resistors R11, R12, a substantial resistance value across opposing ends of resistor circuit 138 attains 3RΩ. As the resistance value of the resistor circuit increases, a current flowing through node N12 decreases. As a result, the frequency of clock ICLK output by ring oscillator 112 is lowered.

In contrast, if control circuit 104 outputs control signal SWSEL2 so that only resistor R11 is selected, a substantial resistance value of resistor circuit 138 attains RΩ. Then, a current flowing through node N12 increases and the oscillation frequency of clock ICLK becomes higher.

In other words, oscillation circuit 106 in Embodiment 2 can increase/decrease the oscillation frequency by controlling the number of resistor stages that is digitally varied as well as control voltage VCONT that is varied in an analog manner. Though the delay stage in the oscillation circuit has been digitally controlled in Embodiment 1, the number of resistor stages in the oscillator is digitally controlled in Embodiment 2. An effect the same as in Embodiment 1 can thus be obtained.

Embodiment 3

In the oscillation circuit in Embodiment 1, the number of delay stages has been digitally controlled while the control voltage has been controlled in an analog manner, so as to obtain a wide lock-in range and an excellent jitter characteristic. Meanwhile, in the oscillation circuit in Embodiment 2, a resistance value in the voltage control unit in the oscillation circuit has been digitally controlled, while the input control voltage has been controlled in an analog manner, so as to obtain an effect the same as in Embodiment 1. Embodiment 3 aims to achieve a similar effect by incorporating into the synchronous clock generation circuit in Embodiment 1 the oscillation circuit in which transistor sizes of the VCO are digitally controlled and the control voltage is subjected to analog control.

Figure 4:
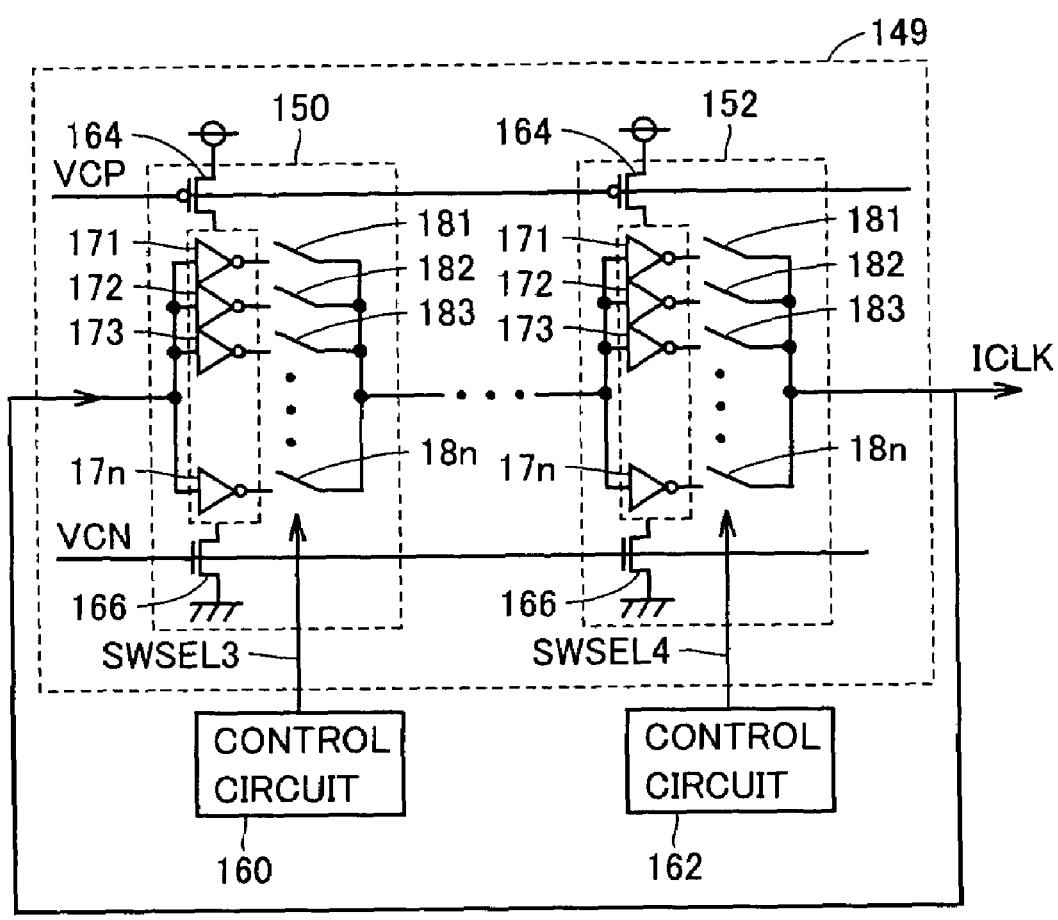
FIG. 4 is a circuit diagram illustrating a control circuit and an oscillation circuit used in Embodiment 3.

In Embodiment 3, synchronous clock generation circuit 1 shown in FIG. 1 includes control circuits 160 to 162 and an oscillation circuit 149 shown in FIG. 4 instead of control circuit 4, delay circuit 20, selection circuit 22, and voltage controlled logic inversion circuit 24.

FIG. 4 is a circuit diagram illustrating control circuits 160 to 162 and oscillation circuit 149 used in Embodiment 3.

Referring to FIG. 4, delay stages 150 to 152 are connected in series, and oscillation circuit 149 is formed as a whole by connecting an odd number of delay stages so as to form a ring. Delay stages 150, 152 receive control signals SWSEL3, SWSEL4 from control circuits 160, 162 respectively. Though not shown, control circuits 160, 162 receive signals UP1, DOWN1, LOCKD from digital PFD 2 similarly to control circuit 4 in FIG. 1. Delay stage 150 includes a P-channel MOS transistor 164 receiving control voltage VCP at its gate, an N-channel MOS transistor 166 receiving control voltage VCN at its gate, inverters 171 to 17$n$ connected to the power supply potential via P-channel MOS transistor 164 and connected to the ground potential via N-channel MOS transistor 166, and switches 181 to 18$n$ provided corresponding to inverters 171 to 17$n$ respectively. An input signal of delay stage 150 is provided in common to inverters 171 to 17$n$. When a corresponding switch is connected, an output from inverters 171 to 17$n$ is connected to an output node of delay stage 150. As delay stage 152 is configured in a manner the same as delay stage 150, description thereof will not be repeated.

When switch 182 makes a transition from the disconnected state to the connected state while switch 181 is connected and switches 182 to 18$n$ are not connected, a driving power of delay stage 150 is substantially doubled. Moreover, when switch 183 makes a transition from the disconnected state to the connected state, the driving power further increases. Increase in the number of the inverters is equivalent to digital control of the transistor size of the inverter. Digital control of the transistor size in such a manner will vary the driving power of each delay stage, whereby the oscillation frequency can be controlled.

Figure 5:
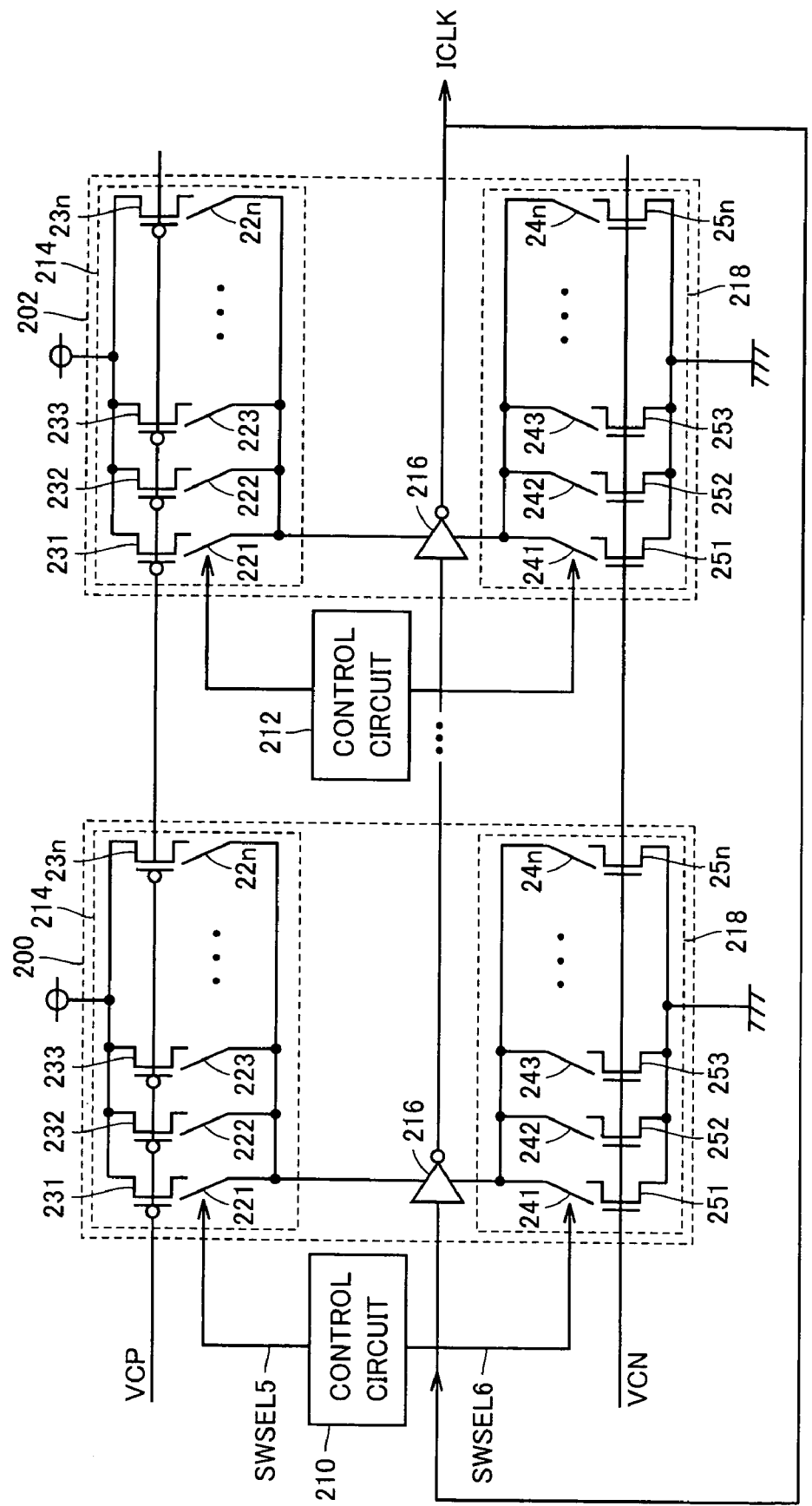
FIG. 5 illustrates a variation of the control circuit and the oscillation circuit shown in FIG. 4.

FIG. 5 illustrates a variation of the control circuit and the oscillation circuit shown in FIG. 4.

Referring to FIG. 5, delay stages 200 to 202 are connected in series, and the oscillation circuit is formed as a whole by connecting an odd number of delay stages so as to form a ring. Control circuits 210 to 212 corresponding to delay stages 200 to 202 respectively are provided.

Delay stage 200 includes an inverter 216, a connection circuit 214 coupling inverter 216 to the power supply potential in order to supply a power supply current, and a connection circuit 218 for coupling inverter 216 to the ground potential.

Connection circuit 214 includes P-channel MOS transistors 231 to 23$n$ receiving control voltage VCP at the gates, and switches 221 to 22$n$ provided corresponding to P-channel MOS transistors 231 to 23$n$ respectively and selecting the corresponding P-channel MOS transistor as a power supply transistor.

Connection circuit 218 includes N-channel MOS transistors 251 to 25$n$ receiving control voltage VCN at the gates, and switches 241 to 24$n$ provided corresponding to P-channel MOS transistors 251 to 25$n$ respectively and selecting the corresponding N-channel MOS transistor as a power supply transistor.

As delay stage 202 is configured in a manner the same as delay stage 200, description thereof will not be repeated.

In the example shown in FIG. 5 as well, when switches 222, 242 are additionally connected while switches 221, 241 are connected and other switches are not connected as shown in FIG. 4, the driving power is increased. Control of the frequency is enabled by varying the number of switches to be connected by means of the control circuit.

Embodiment 4

In Embodiment 4, for the purpose of digital control, a voltage to be applied to a back-gate of a transistor constituting a delay stage in the VCO is selected from a plurality of voltages prepared in advance.

Figure 6:
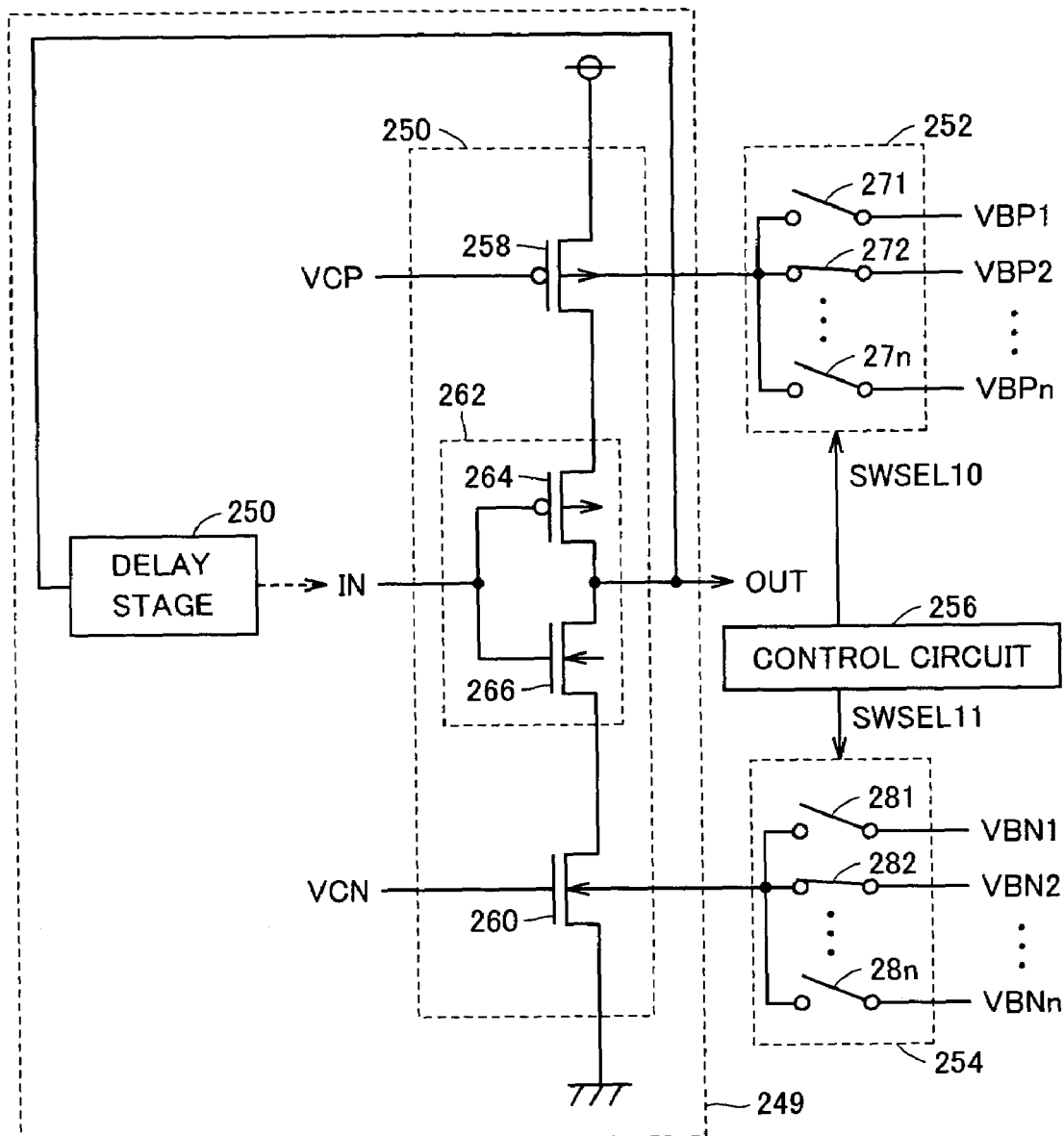
FIG. 6 is a circuit diagram showing one of delay stages connected so as to form a ring, of a VCO used in Embodiment 4.

In Embodiment 4, synchronous clock generation circuit 1 shown in FIG. 1 includes a control circuit 256 shown in FIG. 6 and a VCO 249 implemented by connecting an odd number of delay stages 250 shown in FIG. 6 so as to form a ring, instead of control circuit 4, delay circuit 20, selection circuit 22, and voltage controlled logic inversion circuit 24.

FIG. 6 is a circuit diagram showing one of delay stages 250 connected so as to form a ring, of VCO 249 used in Embodiment 4.

Referring to FIG. 6, delay stage 250 includes a P-channel MOS transistor receiving control voltage VCP at the gate, an N-channel MOS transistor 260 receiving control voltage VCN at the gate, and an inverter 262 connected in series between a P-channel MOS transistor 258 and N-channel MOS transistor 260 in a path through which the power supply current flows.

Inverter 262 includes a P-channel MOS transistor 264 receiving an input signal IN at the gate and having the source connected to the drain of P-channel MOS transistor 258, and an N-channel MOS transistor 266 connected between the drain of P-channel MOS transistor 264 and the drain of N-channel MOS transistor 260 and receiving input signal IN at the gate. The drain of N-channel MOS transistor 266 outputs an output signal OUT.

In Embodiment 4, control circuit 256 and selection circuits 252, 254 are provided in common to the delay stages connected so as to form a ring. Control circuit 256 outputs a signal SWSEL10 to selection circuit 252, and outputs a signal SWSEL11 to selection circuit 254.

Selection circuit 252 includes switches 271 to 27$n$ having one ends coupled to a plurality of potentials VBP1 to VBP$n$ respectively. Switches 271 to 27$n$ have the other ends connected the back-gate of P-channel MOS transistor 258.

Selection circuit 254 includes switches 281 to 28$n$ having one ends coupled to a plurality of potentials VBN1 to VBN$n$ respectively. Switches 281 to 28n have the other ends connected the back-gate of N-channel MOS transistor 260.

An operation will briefly be described. Normally, the ground potential is applied to the back-gate of the N-channel MOS transistor. When a potential lower than this ground potential is applied, the driving power of the N-channel MOS transistor is made smaller. In contrast, a potential higher than the ground potential is applied, the driving power of the N-channel MOS transistor is made larger.

In addition, normally, the back-gate of the P-channel MOS transistor is fixed to a power supply potential VDD. When the potential at the back-gate is set higher than power supply potential VDD, the driving power of the P-channel MOS transistor is made smaller. In contrast, when the potential at the back-gate is set lower than VDD, the driving power of the P-channel MOS transistor is made larger.

In other words, when the back-gate voltage applied to the N-channel MOS transistor is increased and the back-gate voltage applied to the P-channel MOS transistor is lowered, the driving power is made smaller, thereby lowering the oscillation frequency. In contrast, when the back-gate voltage applied to the N-channel MOS transistor is lowered and the back-gate voltage applied to the P-channel MOS transistor is increased, the driving power of the delay stage is made larger and the oscillation frequency becomes higher.

Though FIG. 6 illustrates an example in which the back-gate potentials of P-channel MOS transistors 258, 260 are controlled, all back-gate potentials of P-channel MOS transistors 258, 264 and N-channel MOS transistors 266, 260 may be controlled, or alternatively, only one or any two or three of these transistors may be selected for back-gate potential control.

As described above, an effect the same as in Embodiment 1 can be obtained by incorporating the VCO including the delay stage capable of digital control of the back-gate voltage into the synchronous clock generation circuit shown in FIG. 1.

Embodiment 5

Embodiment 5 is characterized by discrete control of the power supply voltage of the VCO in accordance with the digital control information.

Figure 7:
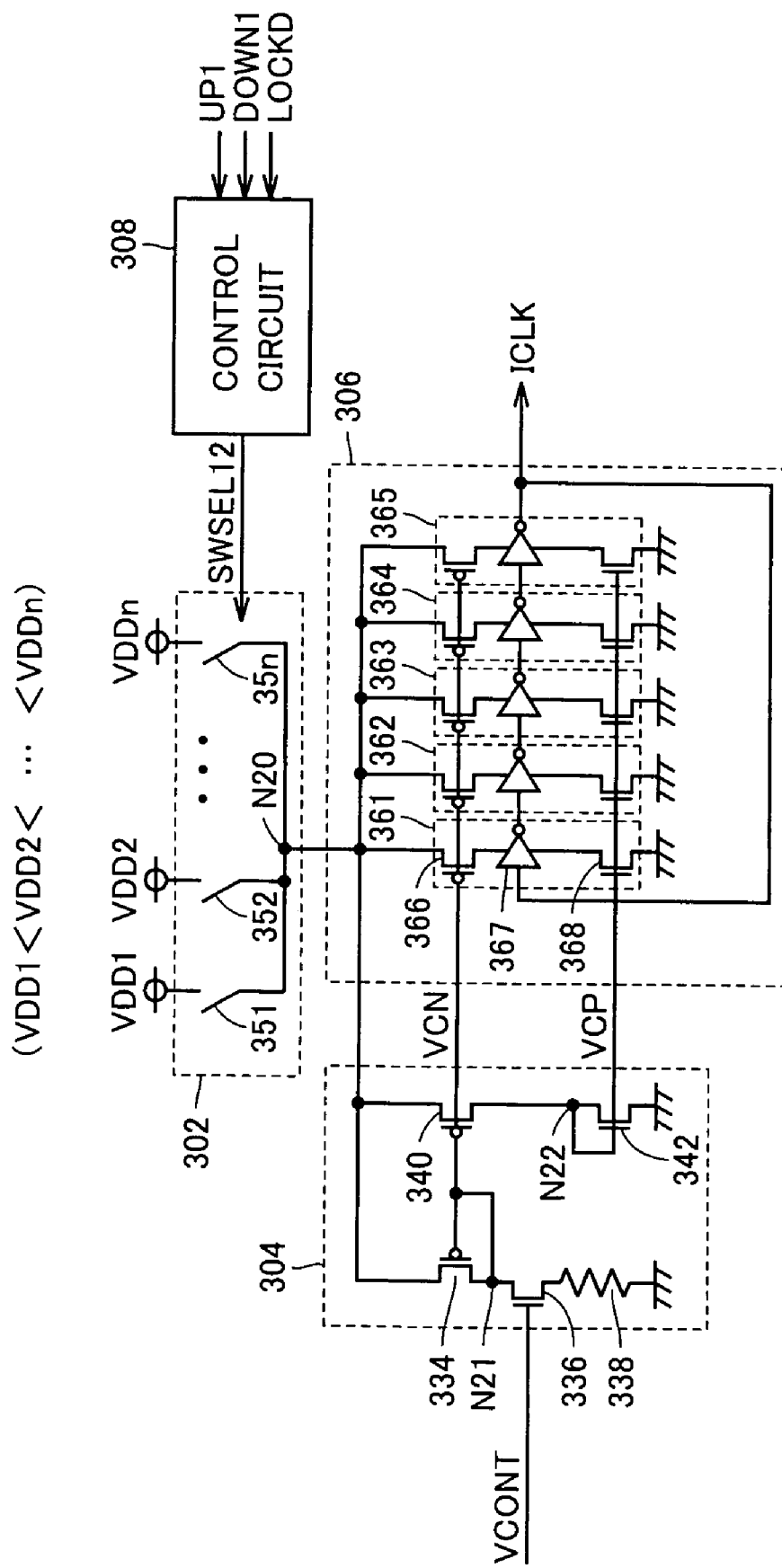
FIG. 7 is a circuit diagram illustrating a control circuit 308, a selection circuit 302, a voltage control circuit 304, and a ring oscillator 306 used in Embodiment 5.

In Embodiment 5, synchronous clock generation circuit 1 shown in FIG. 1 includes a control circuit 308, a selection circuit 302, a voltage control circuit 304, and a ring oscillator 306 shown in FIG. 7, instead of control circuit 4, delay circuit 20, selection circuit 22, and voltage controlled logic inversion circuit 24.

FIG. 7 is a circuit diagram illustrating control circuit 308, selection circuit 302, voltage control circuit 304, and ring oscillator 306 used in Embodiment 5.

Referring to FIG. 7, in Embodiment 5, an oscillation circuit includes control circuit 308 outputting a selection signal SWSEL12 in accordance with control signals UP1, DOWN1 and LOCKD, selection circuit 302 selecting one power supply potential from power supply voltages VDD1, VDD2, . . . , VDDn in accordance with control signal SWSEL12, voltage control circuit 304 receiving control voltage VCONT and outputting control voltages VCN, VCP, and ring oscillator 306 outputting clock signal ICLK of which oscillation frequency varies in accordance with control voltages VCN, VCP.

Selection circuit 302 includes switches 351 to 35n having one ends coupled to power supply potentials VDD1 to VDDn respectively and having the other ends connected to a node N202. One of switches 351 to 35n is selected and connected in accordance with control signal SWSEL12. Power supply potential VDD1 represents a lowest power supply potential, and VDD2, VDD3 and so on to the right sequentially represent higher power supply potentials, respectively.

Voltage control circuit 304 includes a P-channel MOS transistor 334 diode-connected between a node N20 and a node N21, an N-channel MOS transistor 336 connected in series between node N21 and the ground node, and a resistor 338. The gate of N-channel MOS transistor 336 receives control voltage VCONT.

Voltage control circuit 304 further includes a P-channel MOS transistor 340 connected between node N20 and a node N22 and having the gate connected to node N21, and an N-channel MOS transistor 342 diode-connected between node N22 and the ground node. Control voltage VCN is connected to node N21, and control voltage VCP is output from node N22.

Ring oscillator 306 includes five inversion delay circuits 361 to 365 connected in series. An output of inversion delay circuit 365 outputs clock signal ICLK.

Inversion delay circuit 361 includes a P-channel MOS transistor 366 receiving control voltage VCN at the gate, an N-channel MOS transistor 368 receiving control voltage VCP at the gate, and an inverter 367 connected in series between P-channel MOS transistor 366 and N-channel MOS transistor 368 in a path from node N20 to the ground node. As inversion delay circuits 362 to 365 are configured in a manner the same as that of inversion delay circuit 361, description thereof will not be repeated.

As described above, the power supply voltage is varied to n types in accordance with control signal SWSEL12. As the power supply voltage is higher, the output frequency becomes higher. After the power supply voltage is determined, control voltage VCONT is adjusted so as to more finely adjust the oscillation frequency.

Embodiment 6

Embodiment 6 describes frequency control in a discrete manner in the VCO using a differential amplifier as a delay stage, in accordance with digital control information.

Figure 8:
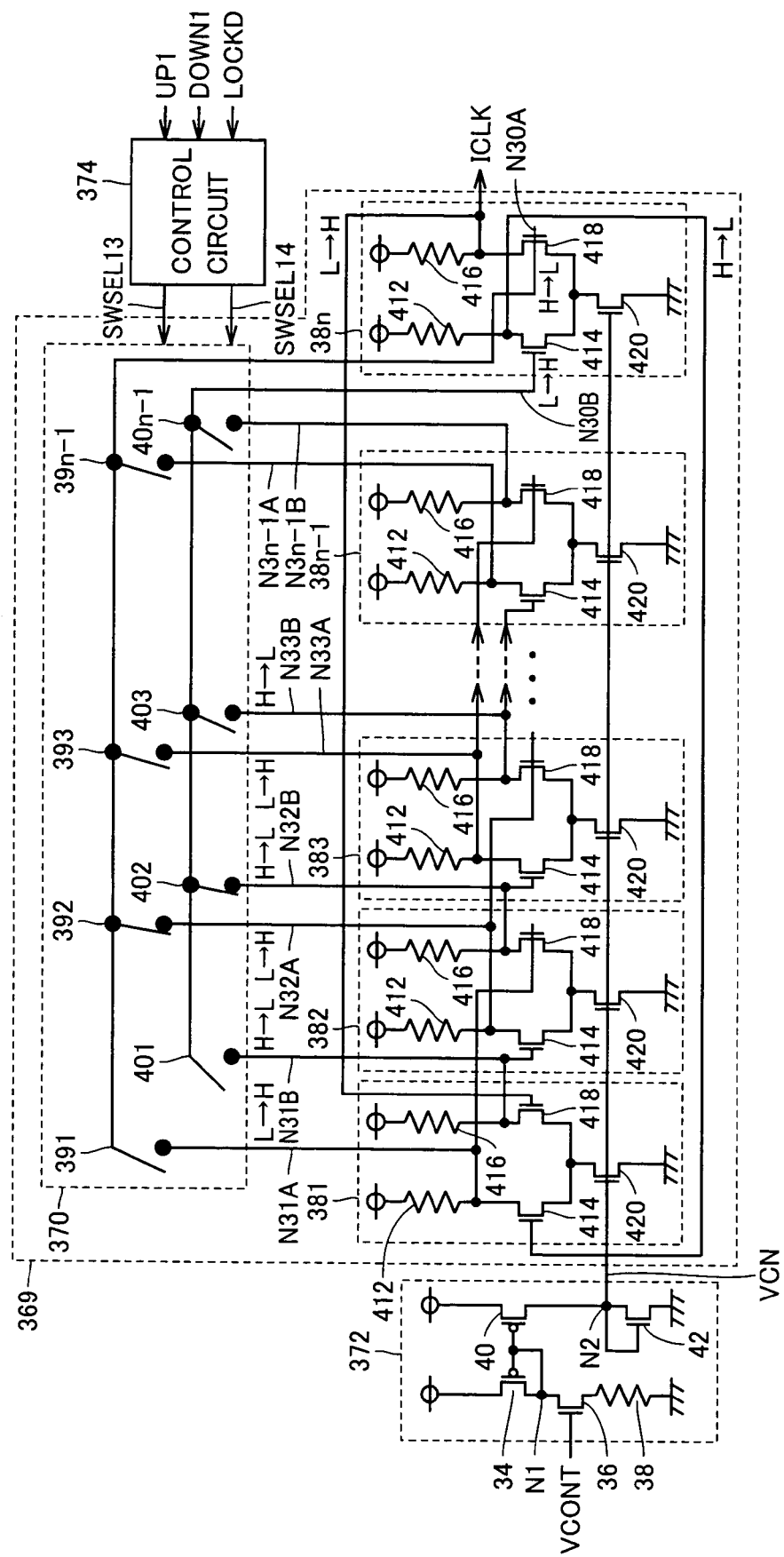
FIG. 8 is a circuit diagram of an oscillation circuit used in Embodiment 6, when the number of delay stages in a differential amplifier type VCO is digitally controlled.

In Embodiment 6, synchronous clock generation circuit 1 shown in FIG. 1 includes a control circuit 374, a voltage control circuit 372, and an oscillation circuit 369 shown in FIG. 8 instead of control circuit 4, voltage control unit 26, delay circuit 20, selection circuit 22, and voltage controlled logic inversion circuit 24.

FIG. 8 is a circuit diagram of control circuit 374, voltage control circuit 372, and oscillation circuit 369 used in Embodiment 6, when the number of delay stages of the differential amplifier type VCO is digitally controlled.

Referring to FIG. 8, in Embodiment 6, voltage control circuit 372 outputting control voltage VCN in accordance with control voltage VCONT and control circuit 374 outputting control signals SWSEL13, SWSEL14 in accordance with control signals UP1, DOWN1 and LOCKD are used. Oscillation circuit 369 includes a selection circuit 370 and delay stage 381 to 38n.

Delay stage 381 includes a resistor 412 having one end coupled to the power supply node; an N-channel MOS transistor 414 having the drain connected to the other end of resistor 412 and receiving a first input signal at the gate; a resistor 416 having one end coupled to the power supply potential; an N-channel MOS transistor 418 having the drain connected to the other end of resistor 416 and receiving a second input signal complementary to the first input signal at the gate; and an N-channel MOS transistor 420 having the drain connected to the sources of N-channel MOS transistors 414, 418, having the source coupled to the ground potential and receiving control voltage VCN at the gate. As delay stages 382 to 38n are configured in a manner the same as that of delay stage 381, description thereof will not be repeated.

Selection circuit 370 includes a switch 391 connecting an output node N31A of delay stage 381 to an input node N30A of delay stage 38n, a switch 401 connecting an output node N31B of delay stage 381 to an input node N30B of delay stage 38n, a switch 392 connecting an output node N31A of delay stage 382 to node N30A, a switch 402 connecting an output node N32B of delay stage 382 to node N30B, a switch 393 connecting an output node N33A of delay stage 383 to node N30A, a switch 403 connecting an output node N33B of delay stage 383 to node N30B, a switch 39n-1 connecting an output node N3n-1A of delay stage 38n-1 to node N30A, and a switch 40n-1 connecting an output node N3n-1B of delay stage 38n-1 to node N30B.

Any one of switches 391 to 39n-1 is selected and connected in accordance with signal SWSEL13. On the other hand, any one of switches 401 to 40n-1 is selected and connected in accordance with signal SWSEL14. Here, control circuit 374 outputs signals SWSEL13, SWSEL14 so that complementary outputs from selected one delay stage are provided to nodes N30A, N30B respectively.

Here, an oscillation operation will briefly be described. It is assumed that node N30A is set from H level to L level and node N30B is set from L level to H level. As a differential amplifier circuit is used as the delay stage, the L level here is slightly higher than the ground potential and the H level here is slightly lower than the power supply potential. For the sake of simplicity, however, such levels are also referred to as H level and L level respectively in the description below.

In delay stage 38n, a large amount of current flows through transistor 414, while a small amount of current flows through transistor 418. Accordingly, the signal output from the drain of N-channel MOS transistor 414 is set from H level to L level. On the other hand, signal ICLK output from the drain of transistor 418 is set from L level to H level.

Here, node N31A serving as the output of delay stage 381 is set from L level to H level. On the other hand, node N31B serving as the output complementary to node N31A is set from H level to L level. An output set from L level to H level among outputs of delay stages 381 to 38n-1 is provided to switches 391 to 39n-1, and selectively provided to input node N30A of delay stage 38n. Meanwhile, an output set from H level to L level among outputs from delay stages 381 to 38n-1 is connected to switches 401 to 40n-1, one of which is selected and connected to input node N30B of delay stage 38n.

Therefore, when switch 392 is connected, node N30A that has initially been set from H level to L level is now set from L level to H level. In addition, when switch 402 is connected, node N30B that has initially been set from L level to H level is now set from H level to L level. In this manner, node N30A makes a transition from H→L→H . . . , while node N30B repeats oscillation as L→H→L . . . in a manner complementary to node N30A. This is also the case when an output of any delay stage is selected.

In other words, which of the complementary outputs is given to node N30A and node N30B respectively is taken into account, so as to maintain oscillation when selection circuit 370 returns the output of each delay stage to delay stage 38n. Thus, when the differential amplifier circuit having complementary outputs is used as the delay stage, oscillation is maintained even if the number of stages is varied one-by-one, as in the example in which the odd number of inversion delay circuits are connected so as to form a ring.

Figure 9:
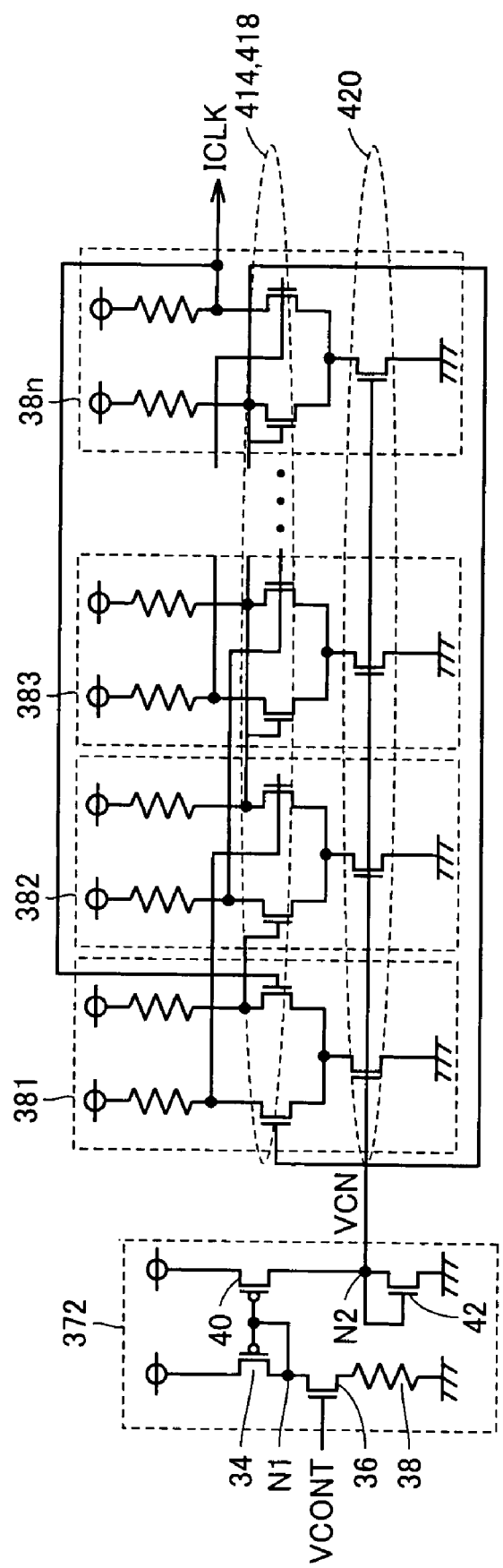
FIG. 9 is an equivalent circuit diagram when a selection circuit 370 in FIG. 8 selects an output of a delay stage.

FIG. 9 is an equivalent circuit diagram when selection circuit 370 in FIG. 8 selects an output of a delay stage.

Referring to FIG. 9, when the number of delay stages is fixed in this manner, a gate potential of N-channel MOS transistor 420 is subjected to analog control, so that the oscillation frequency can finely be adjusted.

Next, digital control of a resistance value in the differential amplifier type VCO will be described. The examples of digital control of the resistance value include control of the resistance of the voltage control circuit, control of the resistance value of the delay stage, and control of both of the above.

First, when the resistance value of the voltage control circuit is controlled, voltage control circuit 372 is to be replaced with voltage control circuit 110 in FIG. 3, instead of changing the number of stages in selection circuit 370 in the configuration shown in FIG. 8. Therefore, description of such a configuration will not be repeated Next, an example in which the resistance value of the differential amplifier stage is varied in a discrete manner in accordance with a digital control signal will be described.

Figure 10:
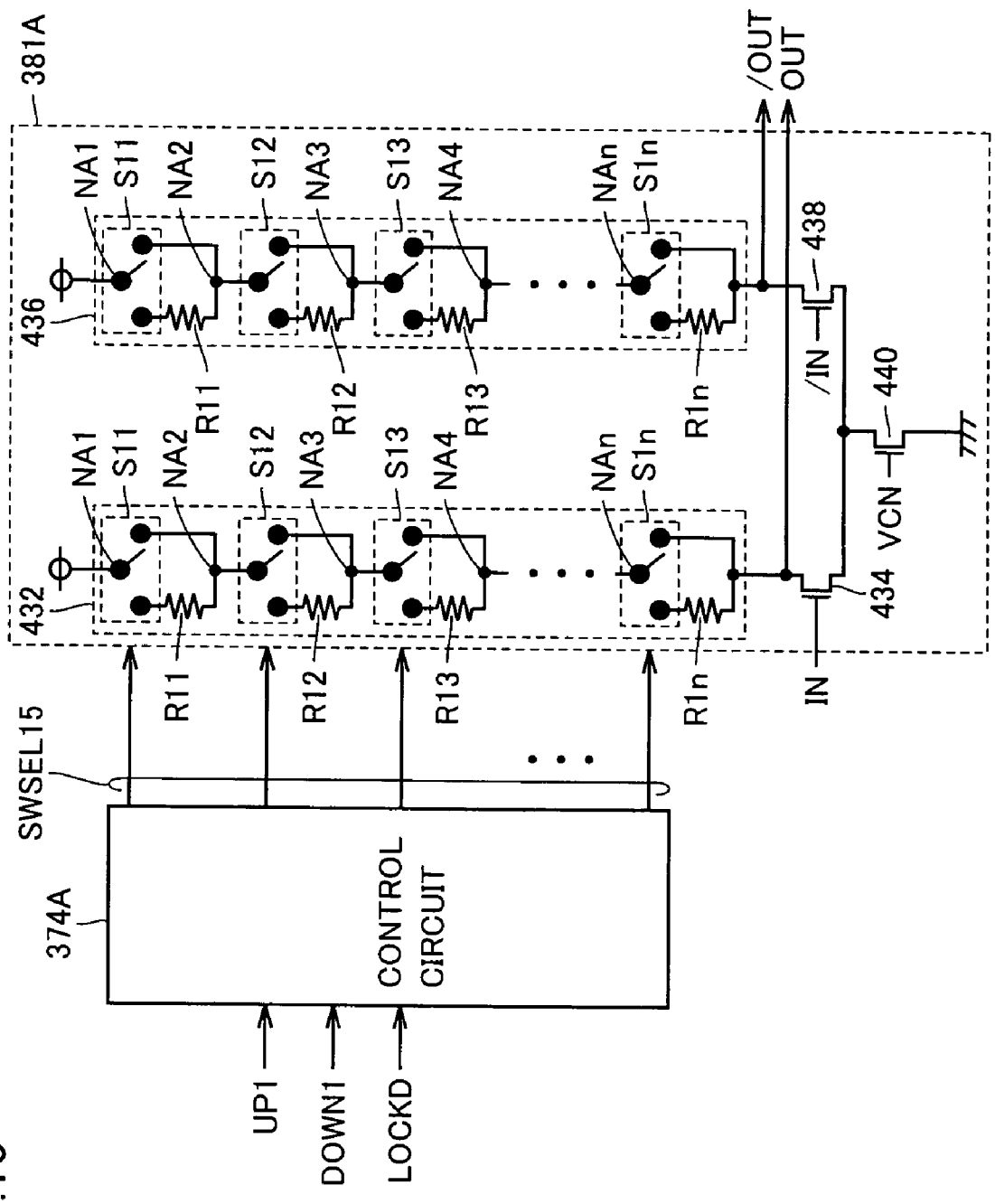
FIG. 10 is a circuit diagram showing a configuration in which a resistance value of a delay stage in a differential amplifier type VCO is digitally controlled.

FIG. 10 is a circuit diagram showing a configuration in which a resistance value of a delay stage in a differential amplifier type VCO is digitally controlled. Here, a ring oscillator implemented by connecting a plurality of differential amplifiers 381A so as to form a ring and a control circuit 374A described in connection with FIG. 10 should be used, instead of components 370, 381 to 38n and control circuit 374 in the configuration shown in FIG. 8.

Referring to FIG. 10, differential amplifier 381A includes a resistor circuit 432 having one end connected to the power supply node, an N-channel MOS transistor 434 having the drain connected to the other end of resistor circuit 432 and receiving input signal IN at the gate, a resistor circuit 436 having one end connected to the power supply node, an N-channel MOS transistor 438 connected between the other end of resistor circuit 436 and the source of N-channel MOS transistor 434 and receiving a signal/IN at the gate, and an N-channel MOS transistor 440 connected between the source of N-channel MOS transistor 434 and the ground node and receiving control voltage VCN at the gate. The drain of N-channel MOS transistor 434 outputs signal OUT, while the drain of N-channel MOS transistor 438 outputs a signal/OUT.

The resistance values of resistor circuits 432, 436 vary in a discrete manner in accordance with a control signal SWSEL15 output from control circuit 374A. As resistor circuits 432, 436 are configured in a manner the same as that of resistor circuit 138 in FIG. 3, description thereof will not be repeated.

It is noted that the number of transistors 434, 438 may be digitally controlled instead of digitally controlling resistor circuits 432, 436. In that case, a configuration shown in connection circuit 218 in FIG. 5 should be provided instead of transistors 434, 438.

In addition, in the configuration shown in FIG. 9, the back-gates of N-channel MOS transistors 414, 418 and 420 may be digitally controlled by means of the voltage selection circuit as shown in FIG. 6. Moreover, the power supply potential of delay stages 381 to 38n in FIG. 9 may digitally be controlled by using selection circuit 302 in FIG. 7.

As described above, as to the differential type VCO, an effect the same as in Embodiments 1 to 5 can be obtained by digitally controlling the number of differential amplifier stages, the resistance value of the differential amplifier, the transistor size, the back-gate voltage, and the power supply voltage in addition to the control voltage.

Embodiment 7

Figure 11:
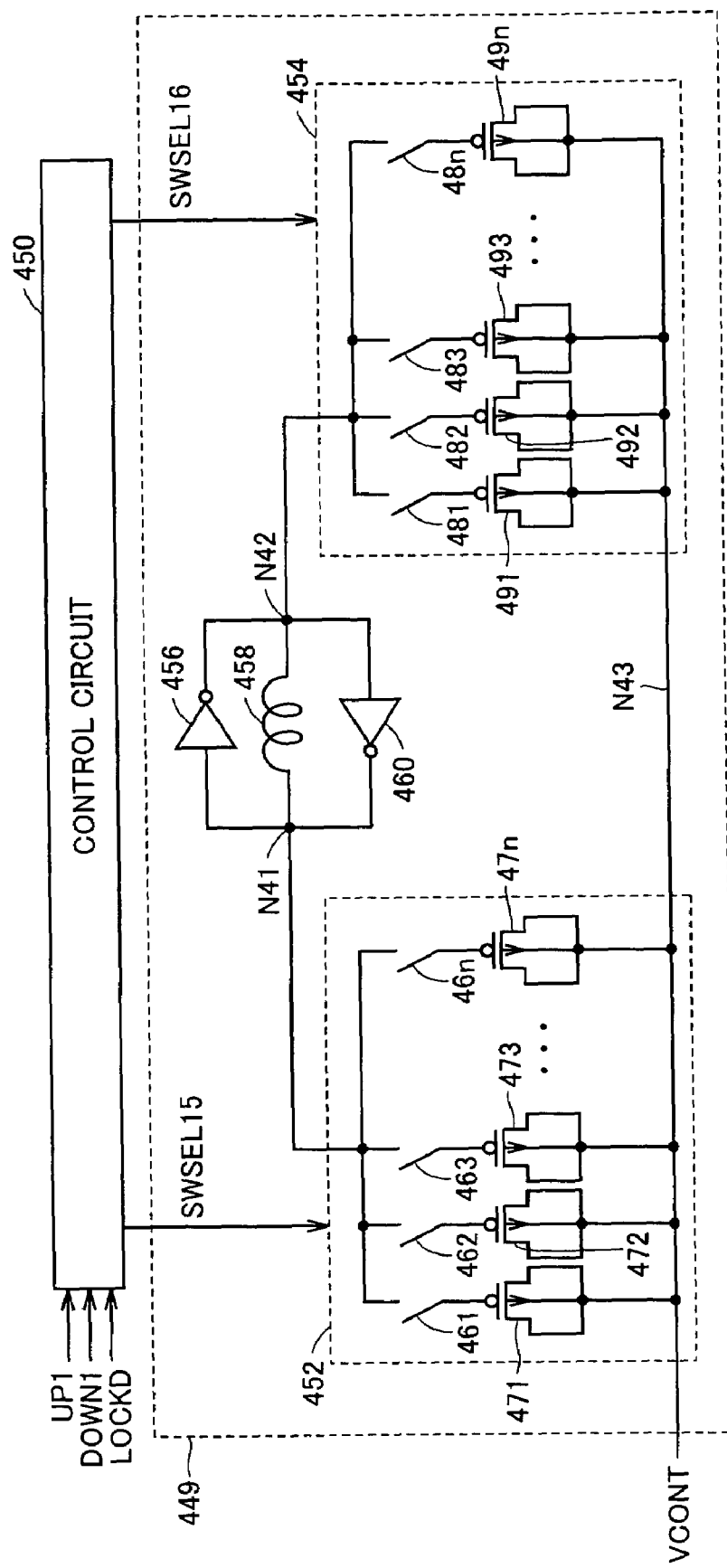
FIG. 11 is a circuit diagram showing a configuration of an oscillation circuit used in Embodiment 7.

In Embodiment 7, synchronous clock generation circuit 1 in FIG. 1 includes a control circuit 450 and an oscillation circuit 449 shown in FIG. 11, instead of control circuit 4 and oscillation circuit 6 respectively.

FIG. 11 is a circuit diagram showing a configuration of oscillation circuit 449 used in Embodiment 7.

Referring to FIG. 11, control circuit 450 in Embodiment 7 outputs signals SWSEL15, SWSEL16 in accordance with control signals UP1, DOWN1 and LOCKD. Oscillation circuit 449 includes a variable capacitance circuit 452 connected between a node N41 and a node N43, a variable capacitance circuit 454 connected between a node N42 and node N43, an inductance 458 connected between node N41 and node N42, an inverter 456 having an input connected to node N41 and having an output connected to node N42, and an inverter 460 having an input connected to node N42 and having an output connected to node N41.

Variable capacitance circuit 452 includes P-channel MOS transistors 471 to 47n having the drain, the source and the back-gate connected to node N43, and switches 461 to 46n respectively connecting the gates of P-channel MOS transistors 471 to 47n to node N41. A switch to be connected in response to signal SWSEL15 is selected from switches 461 to 46n.

Variable capacitance circuit 454 includes P-channel MOS transistors 491 to 49n having the drain, the source and the back-gate connected to node N43, and switches 481 to 48n respectively connecting the gates of P-channel MOS transistors 491 to 49n to node N42. A switch to be connected in response to signal SWSEL16 is selected from switches 481 to 48n.

Node N43 receives control voltage VCONT. P-channel MOS transistors 471 to 47n, 491 to 49n can be regarded as capacitive elements. Here, a capacitance between gate substrates of the P-channel MOS transistor varies in accordance with control voltage VCONT. The oscillation frequency of the oscillation circuit shown in FIG. 11 is determined by the capacitance of variable capacitance circuits 452, 454 and the value of inductance 458. Though not shown, when oscillation starts, node N41 or N42 outputs clock signal ICLK in FIG. 1.

Using switches 461 to 46n, 481 to 48n, the capacitance value is digitally controlled, and control voltage VCONT is varied. Accordingly, the capacitance can be varied more finely in an analog manner, thus enabling fine control of the oscillation frequency over a wide range. An effect the same as in Embodiment 1 can be obtained by employing such an oscillator instead of oscillation circuit 6 in FIG. 1.

Embodiment 8

In Embodiment 7, digital control of the capacitance value of an LC oscillation type VCO has been described. In Embodiment 8, digital control of an inductance value of the LC oscillation type VCO will be described.

Figure 12:
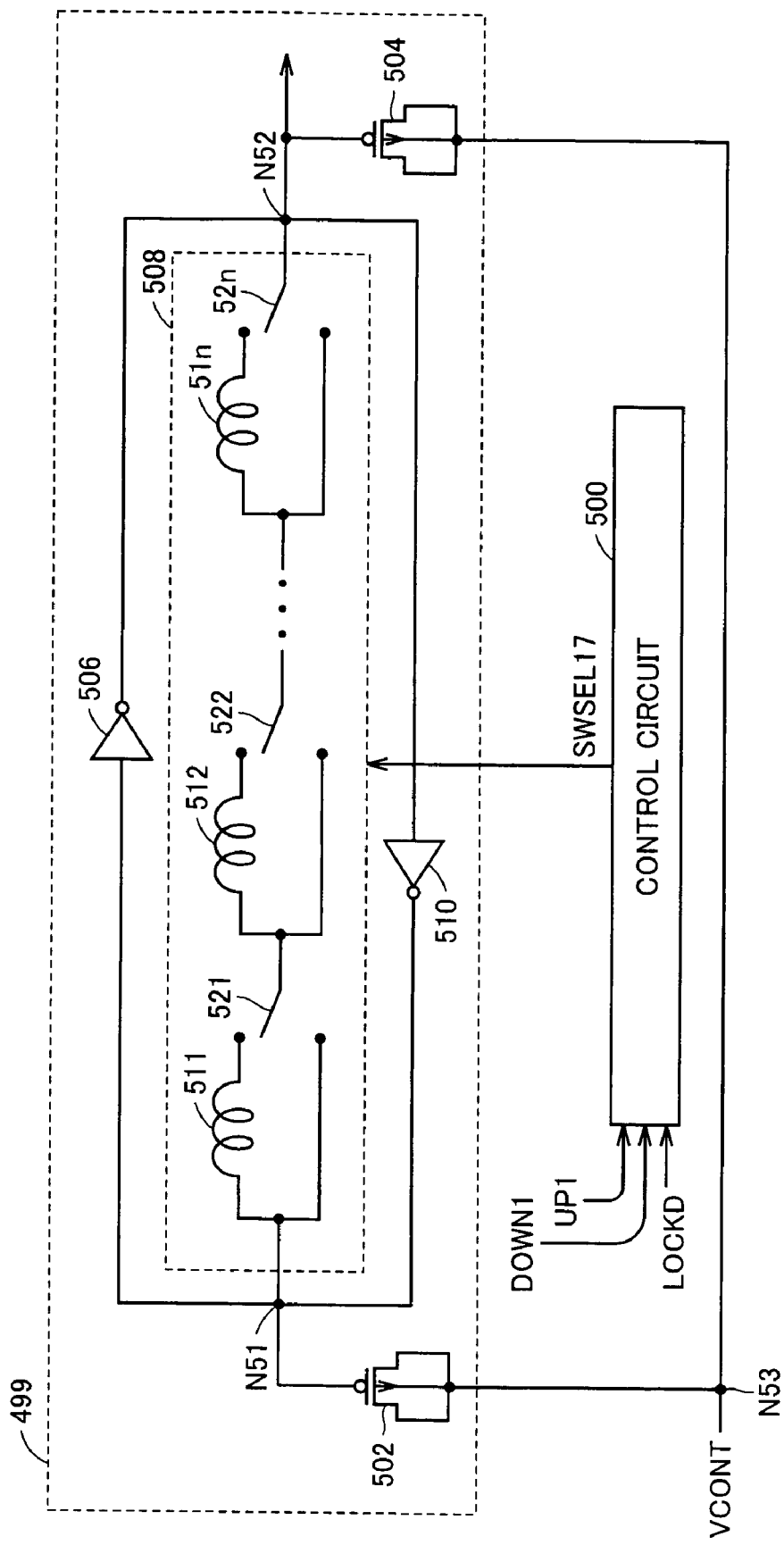
FIG. 12 is a circuit diagram of an oscillation circuit used in Embodiment 8.

In Embodiment 8, synchronous clock generation circuit 1 shown in FIG. 1 includes a control circuit 500 and an oscillation circuit 499 shown in FIG. 12 instead of control circuit 4 and oscillation circuit 6.

FIG. 12 is a circuit diagram of oscillation circuit 499 used in Embodiment 8.

Referring to FIG. 12, control circuit 500 used in Embodiment 8 outputs a signal SWSEL17 in accordance with control signals DOWN1, UP1 and LOCKD. Oscillation circuit 499 includes a P-channel MOS transistor 502 having the gate connected to a node N51 and having the drain, the source and the back-gate connected to a node N53, a P-channel MOS transistor 504 having the gate connected to a node N52 and having the drain, the source and the back-gate connected to node N53, an inverter 506 having an input connected to node N51 and having an output connected to node N52, an inverter 510 having an input connected to node N52 and having an output connected to node N51, and a variable inductance 508 connected between node N51 and node N52 and having an inductance value varied in accordance with signal SWSEL17. Variable inductance 508 includes inductances 511 to 51n and switches 521 to 52n selecting whether or not each of inductances 511 to 51n is to work.

Each inductance of inductances 511 to 51n is represented as La. When switch 521 is connected so as to select an upper node and other switches are connected so as to select a lower node, solely inductance 511 works. Here, inductance value of variable inductance 508 is set to La.

When switch 522 in addition to switch 521 is connected so as to select the upper node, inductances 511, 512 are activated and the inductance of variable inductance 508 is set to 2 La.

Similarly, when the number of switches connected to the upper node is increased, the inductance of variable inductance 508 increases, thereby enabling control of the oscillation frequency.

An effect the same as in Embodiment 1 can be obtained by incorporating such an oscillator as the oscillator in the synchronous clock generation circuit shown in FIG. 1.

Embodiment 9

In Embodiments 1 to 8, constant voltage V0 has been applied as an initial value of control voltage VCONT in the operation at the first step. In Embodiment 9, ½×VDD is selected as the constant voltage. There are a variety of methods to generate the voltage of ½×VDD, and constant voltage source 16 shown in FIG. 13 may be used, for example.

Figure 13:
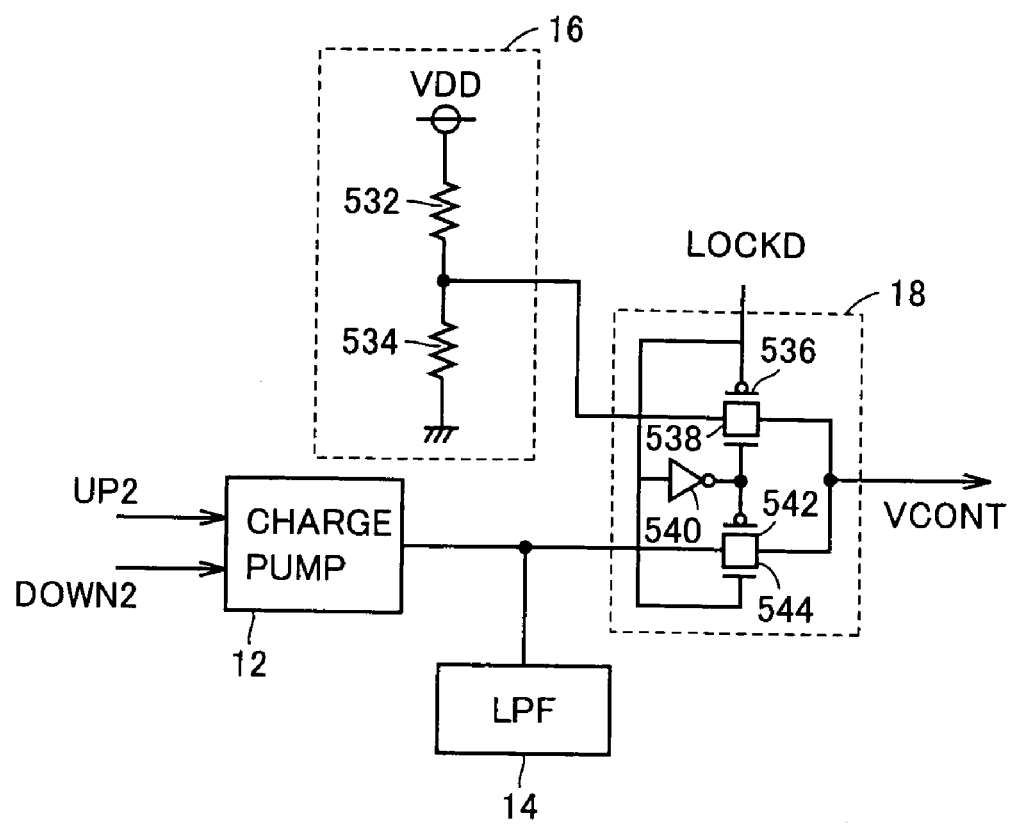
FIG. 13 is a circuit diagram illustrating a constant voltage source 16 and a selector 18 used in Embodiment 9.

FIG. 13 is a circuit diagram illustrating constant voltage source 16 and selector 18 used in Embodiment 9.

Referring to FIG. 13, constant voltage source 16 includes two resistors 532, 534 connected in series between the power supply node and the ground node and each having a resistance value R. A voltage at a tap between resistors 532, 534 is applied to selector 18.

Selector 18 includes a P-channel MOS transistor 536 connected between a node receiving an output from constant voltage source 16 and a node outputting voltage VCONT and receiving signal LOCKD at the gate, an inverter 540 receiving and inverting signal LOCKD, and an N-channel MOS transistor 538 connected between the node receiving the output from constant voltage source 16 and the node outputting voltage VCONT and receiving an output from inverter 540 at the gate.

Selector 18 further includes a P-channel MOS transistor 542 connected between a node receiving an output from the charge pump and the node outputting voltage VCONT and receiving the output from inverter 540 at the gate, and an N-channel MOS transistor 544 connected between the node receiving the output from the charge pump and the node outputting voltage VCONT and receiving signal LOCKD at the gate.

According to the configuration above, in Embodiment 9, ½×VDD is provided as the initial value of control voltage VCONT. A voltage around /1;2 VDD attains an excellent characteristic of the VCO, and a more desirable jitter characteristic can be obtained.

Embodiment 10

In Embodiment 9, a voltage of ½×VDD has been applied as the control voltage applied to the oscillation circuit in the operation at the first step. This voltage is assumed as a voltage slightly lower than ½×VDD. A semiconductor circuit generates heat when it operates. When the temperature of a semiconductor chip is raised, a transistor characteristic is deteriorated. That is, if the temperature rises even when the same control voltage is applied, the oscillation frequency of the oscillator is lowered. Accordingly, even if the voltage of ½×VDD is applied in the operation at the first step, the temperature of the chip will have been raised at the time of locking in the operation at the second step. This means the possibility of locking at a voltage higher than ½×VDD.

Then, if a voltage lower than ½×VDD by a value taking into account variation due to the temperature is set initially, locking around ½×VDD is finally achieved, thereby obtaining an excellent characteristic.

In Embodiment 9, each of resistors 532, 534 has the same resistance value of R, so as to obtain a generated constant voltage of ½×VDD. On the other hand, in Embodiment 10, resistors 532, 534 have resistance values of 6 R, 4 R respectively, taking into account variation due to the temperature. Here, the generated constant voltage is set to ½×VDD−0.1 VDD=0.4 VDD As described above, if the constant voltage is initially set to a value taking into account variation due to the temperature, for example to a voltage lower than ½×VDD by 0.1 VDD, i.e., to 0.4 VDD, variation in the frequency will be small even after the temperature is stabilized later. Thus, locking around ½×VDD is finally achieved, thereby obtaining an excellent characteristic.

Embodiment 11

Figure 14:
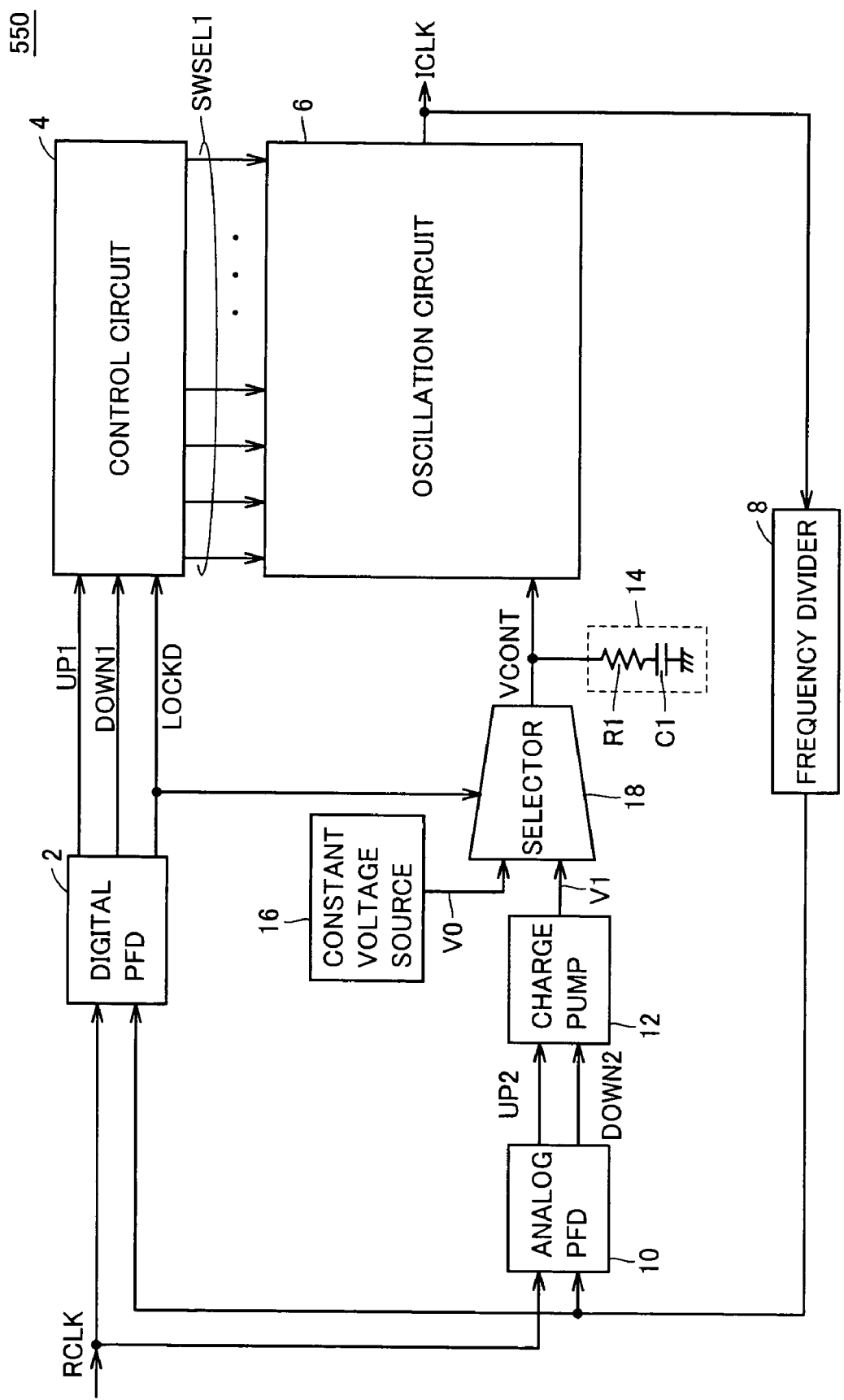
FIG. 14 is a block diagram showing a configuration of a synchronous clock generation circuit 550 in Embodiment 11.
Figure 15:
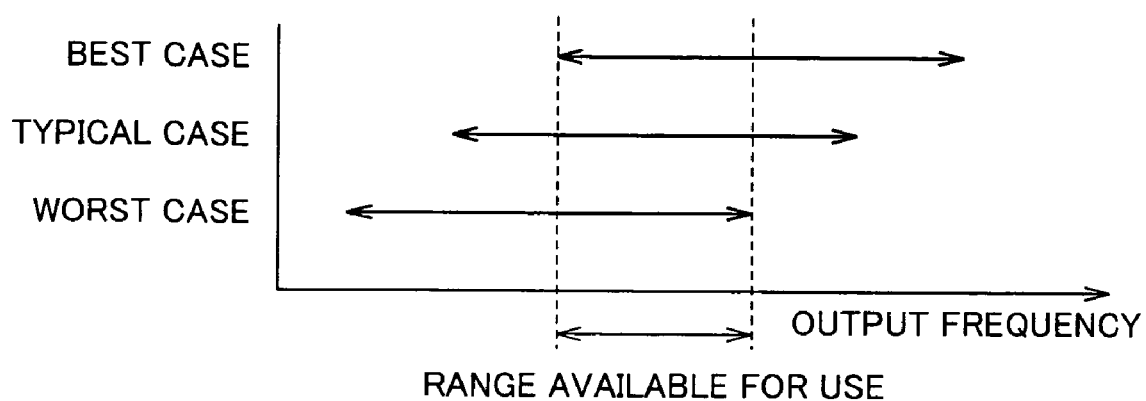
FIG. 15 illustrates a range available for use in the VCO.

FIG. 14 is a block diagram showing a configuration of a synchronous clock generation circuit 550 in Embodiment 11.

Referring to FIG. 14, synchronous clock generation circuit 550 is different from synchronous clock generation circuit 1 shown in FIG. 1 in that a position of loop filter 14 is moved toward an output side of the selector. Accordingly, when selector 18 selects constant voltage V0 output by constant voltage source 16 in the operation at the first step, capacitor C1 in loop filter 14 stores charges comparable to voltage V0. As the configuration in FIG. 14 is otherwise the same as that in FIG. 1, description thereof will not be repeated.

Then, when selector 18 selects an output of charge pump 12 in the operation at the second step, a locking operation as the analog PLL circuit starts with the voltage value of constant voltage source 16 being maintained even immediately after switching of selector 18. This is because capacitance of capacitor C1 in loop filter 14 is considerably larger than other capacitances. Therefore, as compared with Embodiment 1 in which the locking operation of the analog PLL circuit is started from the initial value of the loop filter, a time for lock-in can be shortened by a time period required for attaining the voltage of the constant voltage source.

Though Embodiments 1 to 11 have exemplarily introduced a PLL circuit as a clock synchronizer, the present invention is applicable to other synchronous clock generation circuits such as a DLL circuit so long as analog control and digital control according to the present invention are both employed in a delay stage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous clock generation circuit, comprising:
   an oscillation circuit providing an output clock signal having an oscillation frequency varied in a discrete manner in accordance with digital control information and providing said output clock signal having an oscillation frequency continuously varied in accordance with analog control information; and
   a control circuit; wherein
   said control circuit temporarily fixes said analog control information to a prescribed value and controls said digital control information in accordance with said output clock signal so as to achieve a first lock state in which a phase difference between said output clock signal and an input clock signal attains at most a first prescribed value, and
   after said first lock state is established, said control circuit fixes said digital control information and controls said analog control information in accordance with said oscillation frequency so as to achieve a second lock state in which a phase difference between said output clock signal and said input clock signal attains at most a second prescribed value; and wherein
   said oscillation circuit includes
   a plurality of delay circuits connected in series,
   a selection circuit selecting one of outputs from said plurality of delay circuits as a selected output in accordance with said digital control information, and
   an inversion delay circuit inverting said selected output and providing the inverted selected output to an input of a delay circuit at a first stage among said plurality of delay circuits, and
   at least one of said plurality of delay circuits and said inversion delay circuit has a delay amount varied in accordance with said analog control information.

2. The synchronous clock generation circuit according to claim 1, wherein
   said oscillation circuit further includes a voltage control circuit outputting a first control voltage and a second control voltage in accordance with said analog control information, and
   said inversion delay circuit includes first and second field effect transistors receiving said first and second control voltages at gates respectively, and
   an inverter connected in series between said first and second field effect transistors in a path from a power supply node to a ground node.

3. The synchronous clock generation circuit according to claim 1, wherein
   said oscillation circuit further includes a voltage control circuit outputting a first control voltage and a second control voltage in accordance with said analog control information, at least one of said plurality of delay circuits includes first and second inversion delay circuits connected in series, and at least one of said first and second inversion delay circuits includes first and second field effect transistors receiving said first and second control voltages at gates respectively, and an inverter connected in series between said first and second field effect transistors in a path from a power supply node to a ground node.

4. A synchronous clock generation circuit, comprising:

an oscillation circuit providing an output clock signal having an oscillation frequency varied in a discrete manner in accordance with digital control information and providing said output clock signal having an oscillation frequency continuously varied in accordance with analog control information; and a control circuit; wherein said control circuit temporarily fixes said analog control information to a prescribed value and controls said digital control information in accordance with said output clock signal so as to achieve a first lock state in which a phase difference between said output clock signal and an input clock signal attains at most a first prescribed value, and after said first lock state is established, said control circuit fixes said digital control information and controls said analog control information in accordance with said oscillation frequency so as to achieve a second lock state in which a phase difference between said output clock signal and said input clock signal attains at most a second prescribed value; and wherein said oscillation circuit includes a ring oscillator having an oscillation frequency varied in accordance with a first control voltage, and a voltage control circuit outputting said first control voltage in accordance with said analog control information, and said voltage control circuit includes a first field effect transistor of a first conductivity type, diode-connected between a node receiving a first power supply potential and a first internal node outputting said first control voltage, a second field effect transistor of a second conductivity type connected between said first internal node and a second internal node and receiving a control voltage in accordance with said analog control information at its gate, and a resistor circuit connected between said second internal node and a node receiving a second power supply potential and having a resistance value across opposing ends varied in a discrete manner in accordance with said digital control information.

5. The synchronous clock generation circuit according to claim 4, wherein said ring oscillator includes an odd number of inversion delay circuits connected in series so as to form a ring, at least one of said odd number of inversion delay circuits includes first and second field effect transistors receiving said first and second control voltages at gates respectively, and an inverter connected in series between said first and second field effect transistors in a path from a power supply node to a ground node, and said voltage control circuit includes a third field effect transistor of said first conductivity type, connected between the node receiving said first power supply potential and a third internal node outputting said second control voltage and receiving said first control voltage at its gate, and a fourth field effect transistor of said first conductivity type, diode-connected between said third internal node and the node receiving said second power supply potential.

6. A synchronous clock generation circuit, comprising:

an oscillation circuit providing an output clock signal having an oscillation frequency varied in a discrete manner in accordance with digital control information and providing said output clock signal having an oscillation frequency continuously varied in accordance with analog control information; and a control circuit; wherein said control circuit temporarily fixes said analog control information to a prescribed value and controls said digital control information in accordance with said output clock signal so as to achieve a first lock state in which a phase difference between said output clock signal and an input clock signal attains at most a first prescribed value, and after said first lock state is established, said control circuit fixes said digital control information and controls said analog control information in accordance with said oscillation frequency so as to achieve a second lock state in which a phase difference between said output clock signal and said input clock signal attains at most a second prescribed value; and wherein said oscillation circuit includes a voltage control circuit outputting a first control voltage in accordance with said analog control information, and a ring oscillator having an oscillation frequency varied in accordance with said first control voltage, and said ring oscillator includes an odd number of inversion delay circuits having a driving power varied in a discrete manner in accordance with said digital control information and connected in series so as to form a ring.

7. The synchronous clock generation circuit according to claim 6, wherein at least one of said odd number of inversion delay circuits includes a field effect transistor receiving said first control voltage at its gate, a plurality of inverters receiving supply of a power supply current from said field effect transistor and inverting an input signal, and a plurality of switching circuits provided corresponding to said plurality of inverters respectively and connecting an output from a corresponding inverter to an output node in accordance with said digital control information.

8. The synchronous clock generation circuit according to claim 6, wherein at least one of said odd number of inversion delay circuits includes a plurality of field effect transistors receiving said first control voltage at its gate, a plurality of switching circuits provided corresponding to said plurality of field effect transistors respectively and selecting a corresponding field effect transistor as a power supply transistor, and an inverter receiving supply of a power supply current from said power supply transistor and inverting an input signal.

9. The synchronous clock generation circuit according to claim 6, wherein
at least one of said odd number of inversion delay circuits includes
a first field effect transistor receiving said first control voltage at its gate,
second and third field effect transistors connected in series with said first field effect transistor in a path through which a power supply current flows, receiving a common input signal at its gate, and forming an inverter, and
a potential supply circuit providing a potential selected in accordance with said digital control information among a plurality of potentials to a back-gate of any of said first to third field effect transistors.

10. A synchronous clock generation circuit, comprising:
an oscillation circuit providing an output clock signal having an oscillation frequency varied in a discrete manner in accordance with digital control information and providing said output clock signal having an oscillation frequency continuously varied in accordance with analog control information; and
a control circuit; wherein
said control circuit temporarily fixes said analog control information to a prescribed value and controls said digital control information in accordance with said output clock signal so as to achieve a first lock state in which a phase difference between said output clock signal and an input clock signal attains at most a first prescribed value, and
after said first lock state is established, said control circuit fixes said digital control information and controls said analog control information in accordance with said oscillation frequency so as to achieve a second lock state in which a phase difference between said output clock signal and said input clock signal attains at most a second prescribed value; and wherein
said oscillation circuit includes
a plurality of inverters receiving supply of a power supply current from a power supply node, having a delay time varied in accordance with said analog control information and connected in series so as to form a ring, and
a potential supply circuit providing a potential selected in accordance with said digital control information among a plurality of power supply potentials to said power supply node.

11. A synchronous clock generation circuit, comprising:
an oscillation circuit providing an output clock signal having an oscillation frequency varied in a discrete manner in accordance with digital control information and providing said output clock signal having an oscillation frequency continuously varied in accordance with analog control information; and
a control circuit; wherein
said control circuit temporarily fixes said analog control information to a prescribed value and controls said digital control information in accordance with said output clock signal so as to achieve a first lock state in which a phase difference between said output clock signal and an input clock signal attains at most a first prescribed value, and
after said first lock state is established, said control circuit fixes said digital control information and controls said analog control information in accordance with said oscillation frequency so as to achieve a second lock state in which a phase difference between said output clock signal and said input clock signal attains at most a second prescribed value; and wherein
said oscillation circuit includes
a plurality of differential amplifier circuits each outputting two complementary output signals in response to two complementary input signals and connected in series,
a selection circuit selecting one of said plurality of differential amplifier circuits in accordance with said digital control information,
a voltage control circuit outputting a first control voltage in accordance with said analog control information, and
an inversion delay circuit inverting two complementary output signals from the differential amplifier circuit selected by said selection circuit respectively and providing two complementary inverted output signals to an input of a differential amplifier circuit at a first stage among said plurality of differential amplifier circuits,
said inversion delay circuit includes
a first field effect transistor receiving said first control voltage at its gate and restricting a power supply current,
a first resistance element and a second field effect transistor connected in series between a drain of said first field effect transistor and a power supply node, and
a second resistance element and a third field effect transistor connected in series between the drain of said first field effect transistor and the power supply node, and
gates of said second and third field effect transistors receive two complementary output signals from the differential amplifier circuit selected by said selection circuit respectively.

12. A synchronous clock generation circuit, comprising:
an oscillation circuit providing an output clock signal having an oscillation frequency varied in a discrete manner in accordance with digital control information and providing said output clock signal having an oscillation frequency continuously varied in accordance with analog control information; and
a control circuit; wherein
said control circuit temporarily fixes said analog control information to a prescribed value and controls said digital control information in accordance with said output clock signal so as to achieve a first lock state in which a phase difference between said output clock signal and an input clock signal attains at most a first prescribed value, and
after said first lock state is established, said control circuit fixes said digital control information and controls said analog control information in accordance with said oscillation frequency so as to achieve a second lock state in which a phase difference between said output clock signal and said input clock signal attains at most a second prescribed value; and wherein
said oscillation circuit includes
a plurality of differential amplifier circuits connected in series and outputting two complementary output signals in response to two complementary input signals,
a voltage control circuit outputting a first control voltage in accordance with said analog control information, and
an inversion delay circuit inverting two complementary output signals from the delay circuit selected by said selection circuit respectively and providing two complementary inverted output signals to an input of a differential amplifier circuit at a first stage among said plurality of differential amplifier circuits, said inversion delay circuit includes
a first field effect transistor receiving said first control voltage at its gate and restricting a power supply current,
a first resistor circuit and a second field effect transistor connected in series between a drain of said first field effect transistor and a power supply node, and
a second resistor circuit and a third field effect transistor connected in series between the drain of said first field effect transistor and the power supply node,
gates of said second and third field effect transistors receive two complementary output signals from the differential amplifier circuit selected by said selection circuit respectively, and
said first and second resistor circuits have a resistance value varied in a discrete manner in accordance with said digital control information.

13. A synchronous clock generation circuit, comprising:
an oscillation circuit providing an output clock signal having an oscillation frequency varied in a discrete manner in accordance with digital control information and providing said output clock signal having an oscillation frequency continuously varied in accordance with analog control information; and
a control circuit; wherein
said control circuit temporarily fixes said analog control information to a prescribed value and controls said digital control information in accordance with said output clock signal so as to achieve a first lock state in which a phase difference between said output clock signal and an input clock signal attains at most a first prescribed value, and
after said first lock state is established, said control circuit fixes said digital control information and controls said analog control information in accordance with said oscillation frequency so as to achieve a second lock state in which a phase difference between said output clock signal and said input clock signal attains at most a second prescribed value; and wherein
said oscillation circuit includes
an inductance element connected between first and second internal nodes,
a first inverter having an input connected to said first internal node and having an output connected to said second internal node,
a second inverter having an input connected to said second internal node and having an output connected to said first internal node,
a first capacitive element connected between a third internal node receiving a potential in accordance with said analog control information and said first internal node and having a capacitance varied in a discrete manner in accordance with said digital control information, and
a second capacitive element connected between said third internal node and said second internal node and having a capacitance varied in a discrete manner in accordance with said digital control information.

14. A synchronous clock generation circuit, comprising:
an oscillation circuit providing an output clock signal having an oscillation frequency varied in a discrete manner in accordance with digital control information and providing said output clock signal having an oscillation frequency continuously varied in accordance with analog control information; and
a control circuit; wherein
said control circuit temporarily fixes said analog control information to a prescribed value and controls said digital control information in accordance with said output clock signal so as to achieve a first lock state in which a phase difference between said output clock signal and an input clock signal attains at most a first prescribed value, and
after said first lock state is established, said control circuit fixes said digital control information and controls said analog control information in accordance with said oscillation frequency so as to achieve a second lock state in which a phase difference between said output clock signal and said input clock signal attains at most a second prescribed value; and wherein
said oscillation circuit includes
an inductance circuit connected between first and second internal nodes and having an inductance varied in a discrete manner in accordance with said digital control information,
a first inverter having an input connected to said first internal node and having an output connected to said second internal node,
a second inverter having an input connected to said second internal node and having an output connected to said first internal node,
a first capacitive element connected between a third internal node receiving a potential in accordance with said analog control information and said first internal node, and
a second capacitive element connected between said third internal node and said second internal node.

15. A synchronous clock generation circuit, comprising:
an oscillation circuit providing an output clock signal having an oscillation frequency varied in a discrete manner in accordance with digital control information and providing said output clock signal having an oscillation frequency continuously varied in accordance with analog control information; and
a control circuit; wherein
said control circuit temporarily fixes said analog control information to a prescribed value and controls said digital control information in accordance with said output clock signal so as to achieve a first lock state in which a phase difference between said output clock signal and an input clock signal attains at most a first prescribed value, and
after said first lock state is established, said control circuit fixes said digital control information and controls said analog control information in accordance with said oscillation frequency so as to achieve a second lock state in which a phase difference between said output clock signal and said input clock signal attains at most a second prescribed value; and wherein
said analog control information is given by a voltage, and
said synchronous clock generation circuit further comprises a voltage generation circuit generating a control voltage half a power supply voltage as an initial value for said analog control information.

16. A synchronous clock generation circuit, comprising:
an oscillation circuit providing an output clock signal having an oscillation frequency varied in a discrete manner in accordance with digital control information and providing said output clock signal having an oscillation frequency continuously varied in accordance with analog control information; and a control circuit; wherein said control circuit temporarily fixes said analog control information to a prescribed value and controls said digital control information in accordance with said output clock signal so as to achieve a first lock state in which a phase difference between said output clock signal and an input clock signal attains at most a first prescribed value, and after said first lock state is established, said control circuit fixes said digital control information and controls said analog control information in accordance with said oscillation frequency so as to achieve a second lock state in which a phase difference between said output clock signal and said input clock signal attains at most a second prescribed value wherein said analog control information is given by a voltage, and said synchronous clock generation circuit further comprises a voltage generation circuit generating a control voltage offset from half a power supply voltage by a value corresponding to a temperature increase at a steady state of oscillation as an initial value for said analog control information.

17. A synchronous clock generation circuit, comprising:

an oscillation circuit providing an output clock signal having an oscillation frequency varied in a discrete maimer in accordance with digital control information and providing said output clock signal having an oscillation frequency continuously varied in accordance with analog control information; and a control circuit; wherein said control circuit temporarily fixes said analog control information to a prescribed value and controls said digital control information in accordance with said output clock signal so as to achieve a first lock state in which a phase difference between said output clock signal and an input clock signal attains at most a first prescribed value, and after said first lock state is established, said control circuit fixes said digital control information and controls said analog control information in accordance with said oscillation frequency so as to achieve a second lock state in which a phase difference between said output clock signal and said input clock signal attains at most a second prescribed value wherein said control circuit includes a frequency divider dividing a frequency of said output clock signal, first and second phase comparators comparing phases between an output from said frequency divider and said input clock signal, a charge pump circuit inputting/outputting charges to/from a first internal node in accordance with an output from said second phase comparator, a loop filter smoothing a potential of said first internal node, a constant voltage source, and a selector outputting an output potential of said constant voltage source as said analog control information until said first phase comparator detects said first lock state and outputs a potential smoothed by said loop filter as said analog control information after said first phase comparator detects said first lock state.

18. A synchronous clock generation circuit, comprising:

an oscillation circuit providing an output clock signal having an oscillation frequency varied in a discrete maimer in accordance with digital control information and providing said output clock signal having an oscillation frequency continuously varied in accordance with analog control information; and a control circuit; wherein said control circuit temporarily fixes said analog control information to a prescribed value and controls said digital control information in accordance with said output clock signal so as to achieve a first lock state in which a phase difference between said output clock signal and an input clock signal attains at most a first prescribed value, and after said first lock state is established, said control circuit fixes said digital control information and controls said analog control information in accordance with said oscillation frequency so as to achieve a second lock state in which a phase difference between said output clock signal and said input clock signal attains at most a second prescribed value wherein said control circuit includes a frequency divider dividing a frequency of said output clock signal, first and second phase comparators comparing phases between an output from said frequency divider and said input clock signal, a charge pump circuit inputting/outputting charges to/from a first internal node in accordance with an output from said second phase comparator, a constant voltage source, a selector coupling an output potential of said constant voltage source to a second internal node until said first phase comparator detects said first lock state and connecting said first internal node to said second internal node after said first phase comparator detects said first lock state, and a loop filter smoothing a potential of said second internal node for output as said analog control information.

* * * * *